US011956069B2

(12) United States Patent
Mori

(10) Patent No.: US 11,956,069 B2
(45) Date of Patent: Apr. 9, 2024

(54) MULTIPLEXER, FILTER, AND COMMUNICATION DEVICE

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 535 days.

(21) Appl. No.: 17/242,552

(22) Filed: Apr. 28, 2021

(65) Prior Publication Data

US 2021/0250111 A1      Aug. 12, 2021

Related U.S. Application Data

(63) Continuation of application No. PCT/JP2019/039707, filed on Oct. 8, 2019.

(30) Foreign Application Priority Data

Oct. 29, 2018  (JP) ................ 2018-202760

(51) Int. Cl.
*H04J 1/04* (2006.01)
*H03H 7/01* (2006.01)
*H03H 7/075* (2006.01)

(52) U.S. Cl.
CPC ........... *H04J 1/045* (2013.01); *H03H 7/0115* (2013.01); *H03H 7/075* (2013.01); *H03H 7/1758* (2013.01); *H03H 7/1775* (2013.01)

(58) Field of Classification Search
CPC .................................................. H03H 7/0161
See application file for complete search history.

(56) References Cited

U.S. PATENT DOCUMENTS

| 2003/0043759 A1 | 3/2003 | Yamaguchi |
| 2010/0277255 A1 | 11/2010 | Matsushita |

(Continued)

FOREIGN PATENT DOCUMENTS

| JP | H10-322155 A | 12/1998 |
| JP | 2003-158437 A | 5/2003 |

(Continued)

OTHER PUBLICATIONS

Ericsson, Presentation of Specification of TSG: TS 38. 104, Version 1.0.0 [online], 3GPP TSG RAN #78 RP-172268, Dec. 18, 2017, section 5.2, Internet URL: http://www.3gpp.org/ftp/tsg_ran/TSG_RAN/TSGR_78/Docs/RP-172268.zip.

(Continued)

*Primary Examiner* — Charles N Appiah
*Assistant Examiner* — Frank E Donado
(74) *Attorney, Agent, or Firm* — Pearne & Gordon LLP

(57) ABSTRACT

A multiplexer (1) used in a communication device (5) includes an antenna (21) for a first frequency band group including 5GNR and an antenna (22) for a second frequency band group and includes a filter (12) for a first communication band and a filter (13) for a second communication band. The second frequency band group is higher than the first communication band, the second communication band is lower than the first communication band, the filter (12) includes a resonant circuit (31), an inductor (L1) connected to a node (n1) in a series arm path, and an inductor (L2) magnetically coupled with the inductor (L1).

14 Claims, 14 Drawing Sheets

(56) References Cited

U.S. PATENT DOCUMENTS

| | | | |
|---|---|---|---|
| 2013/0210374 A1* | 8/2013 | Fujiwara | H03H 9/46 333/133 |
| 2017/0093554 A1 | 3/2017 | Ebihara | |
| 2017/0272115 A1* | 9/2017 | Saji | H04B 1/0057 |
| 2019/0379355 A1 | 12/2019 | Sugahara et al. | |

FOREIGN PATENT DOCUMENTS

| | | |
|---|---|---|
| JP | 2011-151560 A | 8/2011 |
| JP | 2012-054635 A | 3/2012 |
| JP | 2012-205207 A | 10/2012 |
| JP | 2013-243600 A | 12/2013 |
| JP | 2017-063316 A | 3/2017 |
| WO | 2009/096474 A1 | 8/2009 |
| WO | 2018/159205 A1 | 9/2018 |

OTHER PUBLICATIONS

International Search Report for PCT/JP2019/039707 dated Dec. 17, 2019.
Written Opinion for PCT/JP2019/039707 dated Dec. 17, 2019.

* cited by examiner freq (100.0MHz to 8.000GHz)

freq (100.0MHz to 8.000GHz)

freq (100.0MHz to 8.000GHz)

freq (100.0MHz to 8.000GHz)

WITHOUT MAGNETIC COUPLING freq (100.0MHz to 8.000GHz)

WITH MAGNETIC COUPLING freq (100.0MHz to 8.000GHz)

WITHOUT MAGNETIC COUPLING

WITH MAGNETIC COUPLING

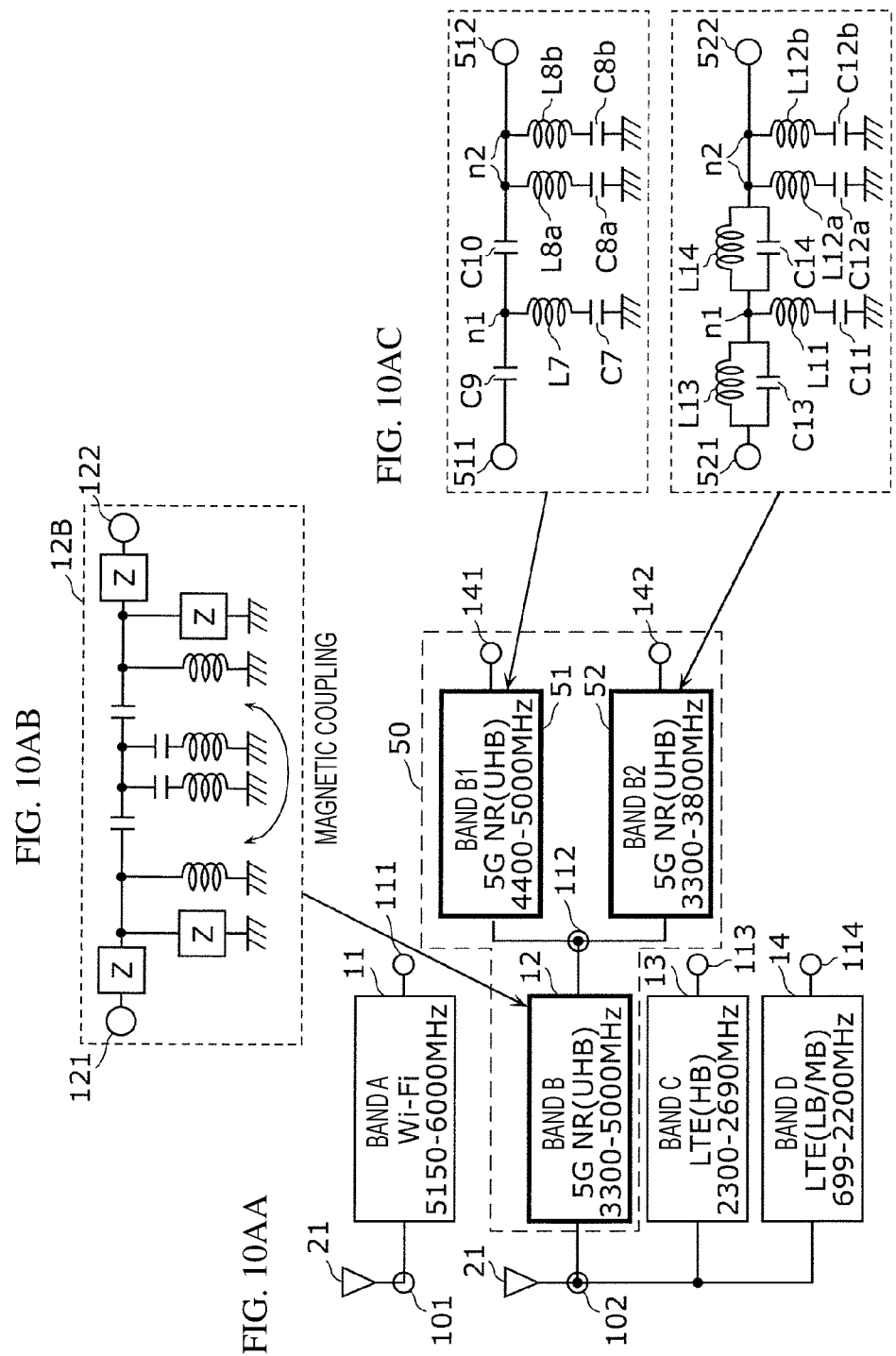

MULTIPLEXER, FILTER, AND COMMUNICATION DEVICE

CROSS REFERENCE TO RELATED APPLICATION

This is a continuation of International Application No. PCT/JP2019/039707 filed on Oct. 8, 2019 which claims priority from Japanese Patent Application No. 2018-202760 filed on Oct. 29, 2018. The contents of these applications are incorporated herein by reference in their entireties.

BACKGROUND

Technical Field

The present disclosure relates to multiplexers, filters, and communication devices.

In recent years, communication systems using higher frequency bands are being developed, and the use of corresponding frequency bands is being allowed. For example, there is 5th Generation New Radio (5GNR) being developed by Third Generation Partnership Project (3GPP). For 5GNR, it is expected that a frequency band higher than or equal to 3 GHz and less than 6 GHz would be available sooner. In practice, when 5GNR is used, it is suitable to suppress interference between a radio frequency signal of 5GNR and radio frequency signals of 4G (LTE: 699 MHz-2690 MHz) and WiFi (registered trademark) (5150-6000 MHz). Because of this, it is desirable that each of filters for 5GNR, for 4G, and for WiFi has a wideband attenuation characteristic in addition to a small loss. Further, in order to be compatible with a multiband system that uses the plurality of frequency bands described above with a single mobile communication device, it is also desirable to have a small-sized multiplexer that demultiplexes and/or multiplexes radio frequency signals of a plurality of frequency bands.

Patent Document 1 discloses a circuit configuration and a bandpass characteristic of a LC filter made up of one or more inductors and one or more capacitors. Specifically, by magnetically coupling two inductors that make up the LC filter, an attenuation pole corresponding to this magnetic coupling is formed in a lower frequency range below a pass band, thereby attenuating a wide range of frequencies in this lower frequency range.

Patent Document 1: International Publication No. 2009/096474

BRIEF SUMMARY

However, in the case where the LC filter described in the Patent Document 1 is employed by a multiplexer that demultiplexes and/or multiplexes a plurality of frequency bands including 5GNR, an attenuation pole caused by the foregoing magnetic coupling is formed not in an attenuation band in the vicinity of a pass band but in an attenuation band away from the pass band. Because of this, it is difficult to secure sufficient attenuation in the attenuation band in the vicinity of the pass band, and thus it is difficult to secure sufficient attenuation in a neighboring frequency band (communication band). That is to say, it is difficult to sufficiently attenuate a wide range of frequencies from a band in the vicinity of a pass band to a band away from the pass band by using only the attenuation pole caused by the foregoing magnetic coupling. In addition, it is difficult to secure steepness at an edge part of the pass band. As a result, isolation between filters that make up a multiplexer becomes insufficient.

The present disclosure provides a small-sized multiplexer, a filter, and a communication device, each having a steep and wideband attenuation characteristic by using a smaller number of circuit elements.

A multiplexer according to one aspect of the present disclosure is a multiplexer for use in a communication device in which a first antenna that radiates and receives a radio frequency signal of a first frequency band group including a communication band of 5th generation new radio (5GNR) and a second antenna that radiates and receives a second frequency band group are installed and includes a common terminal connected to the first antenna, a first input/output terminal and a second input/output terminal, a first filter connected between the common terminal and the first input/output terminal, the first filter allowing a radio frequency signal of a first communication band included in the first frequency band group to pass, and a second filter connected between the common terminal and the second input/output terminal, the second filter allowing a radio frequency signal of a second communication band included in the first frequency band group to pass, wherein the second frequency band group is located in one of a higher frequency range above the first communication band and a lower frequency range below the first communication band, the second communication band is located in another of the higher frequency range above the first communication band and the lower frequency range below the first communication band, the first filter includes a first resonant circuit, a first inductor connected between ground and a first node in a path connecting the common terminal and the first input/output terminal, and a second inductor connected between the ground and a second node in the path, the second node being different from the first node, the second inductor being magnetically coupled with the first inductor, in a bandpass characteristic of the first filter, a first attenuation pole caused by the first resonant circuit and a second attenuation pole caused by the magnetic coupling are formed closer to the second communication band than the first communication band, and a frequency of the first attenuation pole is closer to the first communication band than a frequency of the second attenuation pole.

The present disclosure enables to provide a small-sized multiplexer, a filter, and a communication device, each having a steep and wideband attenuation characteristic by using a smaller number of circuit elements.

BRIEF DESCRIPTION OF DRAWINGS

FIG. 3BC is a graph showing a schematic bandpass characteristic of the filter according to the embodiment.

FIGS. 10AA-10AC include diagrams illustrating a circuit configuration and a relationship among frequency bands employed by a multiplexer according to a modified example 3 of the embodiment.

DETAILED DESCRIPTION

Figure 1:
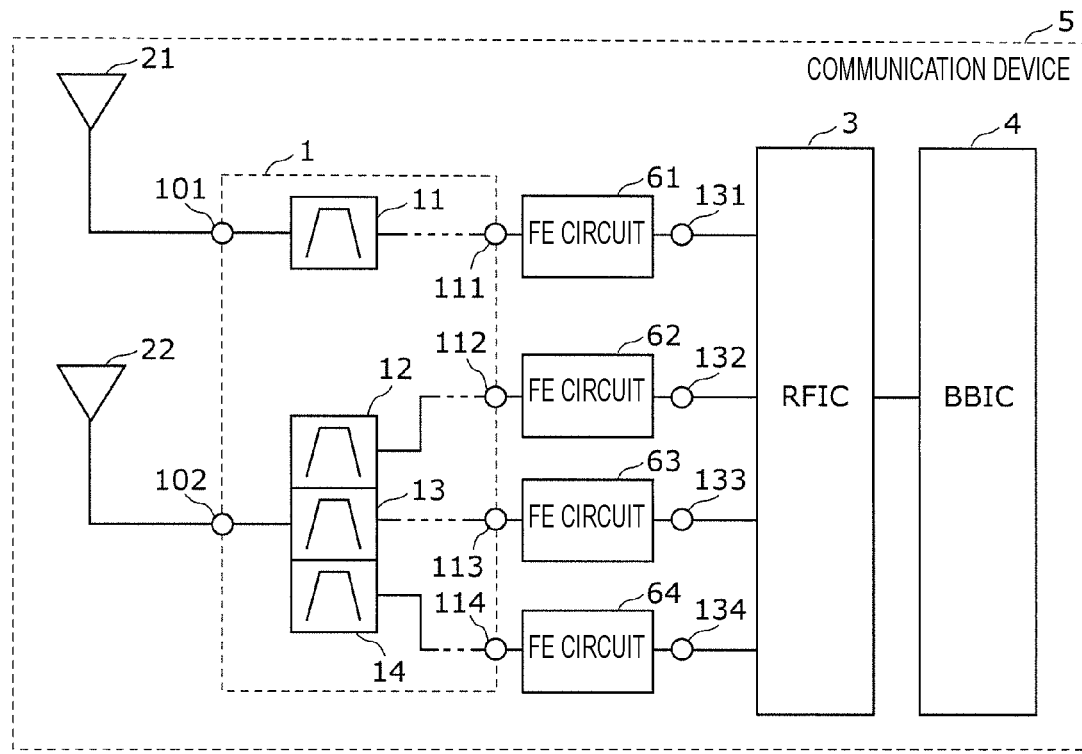
FIG. 1 is a circuit configuration diagram of a communication device according to an embodiment.

Hereinafter, an embodiment of the present disclosure will be described in detail using working examples, modified examples, and the drawings. Note that the working examples and the modified examples, which will be described below, each illustrates a comprehensive or specific example. Numeric values, shapes, materials, constituent elements, arrangements and connection modes of the constituent elements, and the like illustrated in the following working examples and modified examples are mere examples, and not intended to limit the present disclosure. Of constituent elements in the following working examples and modified examples, the constituent elements that are not described in an independent claim will be described as optional constituent elements. Further, dimensions or ratios of dimensions of constituent elements illustrated in the drawings are not necessarily be precise.

Embodiment

1. Configurations of Communication Device, Filter, and Multiplexer

FIG. 1 is a circuit configuration diagram of a communication device 5 according to an embodiment. As illustrated in FIG. 1, the communication device 5 includes a multiplexer 1, front-end (FE) circuits 61, 62, 63, and 64, antennas 21 and 22, a RF signal processing circuit (RFIC) 3, and a base band signal processing circuit (BBIC) 4.

The RFIC 3 is an RF signal processing circuit that performs processing on radio frequency signals being transmitted or received by the antennas 21 and 22. Specifically, the RFIC 3 performs signal processing on radio frequency signals (here, radio frequency receive signals) input from the antennas 21 and 22 via the multiplexer 1 and the FE circuits 61 to 64 using down-converting and the like, and outputs a receive signal generated by this signal processing to the BBIC 4. Further, the RFIC 3 performs signal processing on a transmit signal input from the BBIC 4 using up-converting and the like, and outputs radio frequency signals (here, radio frequency transmit signals) generated by this signal processing to the antennas 21 and 22 via the FE circuits 61 to 64 and the multiplexer 1.

The antenna 21 is a second antenna that radiates and receives a radio frequency signal of a second frequency band group. The antenna 22 is a first antenna that radiates and receives a radio frequency signal of a first frequency band group including a communication band of 5th generation new radio (5GNR).

The multiplexer 1 includes common terminals 101 and 102, input/output terminals 111, 112, 113, and 114, and filters 11, 12, 13, and 14.

The common terminal 101 is connected to the antenna 21. The common terminal 102 is connected to the antenna 22.

The filter 11 is connected to the common terminal 101 at one end and connected to the input/output terminal 111 at the other end and is a filter whose pass band is a fourth communication band included in the second frequency band group.

The filter 12 is connected to the common terminal 102 at one end and connected to the input/output terminal 112 (first input/output terminal) at the other end and is a first filter whose pass band is a first communication band included in the first frequency band group.

The filter 13 is connected to the common terminal 102 at one end and connected to the input/output terminal 113 (second input/output terminal) at the other end and is a second filter in which a second pass band is a second communication band included in the first frequency band group.

The filter 14 is connected to the common terminal 102 at one end and connected to the input/output terminal 114 at the other end and is a filter whose pass band is a third communication band included in the first frequency band group.

The FE circuit 61 is connected to the input/output terminal 111 and the RFIC 3 (via a connection terminal 131). The FE circuit 62 is connected to the input/output terminal 112 and the RFIC 3 (via a connection terminal 132). The FE circuit 63 is connected to the input/output terminal 113 and the RFIC 3 (via a connection terminal 133). The FE circuit 64 is connected to the input/output terminal 114 and the RFIC 3 (via a connection terminal 134). The FE circuits 61 to 64 are each made up of, for example, a filter, an amplifier circuit, a switch, and the like.

Note that in the multiplexer 1 according to the present embodiment, the filters 11 and 14 may be omitted. Further, in the communication device 5 according to the present embodiment, the FE circuits 61 to 64 and the BBIC 4 may be omitted.

Further, the filter 13 may be, for example, any one of an acoustic wave filter that uses a surface acoustic wave (SAW), an acoustic wave filter that uses a bulk acoustic wave (BAW), a LC resonant filter, a dielectric filter, and a LC filter including an acoustic wave resonator, but is not limited thereto.

Here, the second frequency band group is located in one of a higher frequency range above the first communication band and a lower frequency range below the first communication band, the second communication band is located in the other of the higher frequency range above the first communication band and the lower frequency range below the first communication band.

Figure 2:
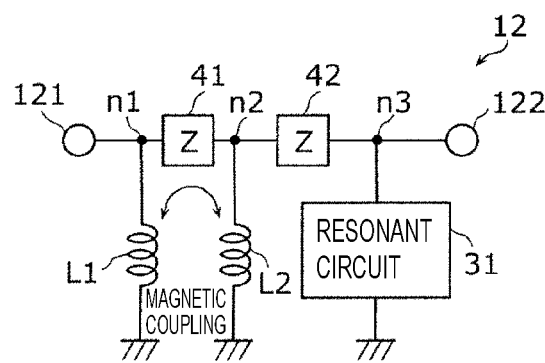
FIG. 2 is a circuit configuration diagram of a first filter that makes up a multiplexer according to the embodiment.

FIG. 2 is a circuit configuration diagram of the filter 12 that makes up the multiplexer 1 according to the embodiment. As illustrated in FIG. 2, the filter 12 includes terminals 121 and 122, a resonant circuit 31, inductors L1 and L2, and impedance elements 41 and 42.

The terminal 121 is connected to the common terminal 102, and the terminal 122 is connected to the input/output terminal 112.

The resonant circuit 31 is a first resonant circuit connected between ground and a node n3 (third node) in a path connecting the terminal 121 and the terminal 122. Note that the resonant circuit 31 may alternatively be arranged in series in the path connecting the terminal 121 and the terminal 122.

The inductor L1 is a first inductor connected between the ground and a node n1 (first node) in the foregoing path. The inductor L2 is a second inductor connected between the ground and a node n2 (second node) in the foregoing path, which is different from the node n1, and is magnetically coupled with the inductor L1.

Note that the term "a node A is different from a node B" is defined to mean that the node A and the node B are connected to each other via an impedance element (an inductor, a capacitor, a resonator, or the like).

Here, in the bandpass characteristic of the filter 12 from the common terminal 102 to the input/output terminal 112, a first attenuation pole caused by the resonant circuit 31 and a second attenuation pole caused by the magnetic coupling between the inductors L1 and L2 are formed in the foregoing other of the higher frequency range above the first communication band and the lower frequency range below the first communication band, and the frequency of the first attenuation pole is closer to the first communication band (the first pass band of the filter 12) than the frequency of the second attenuation pole.

In a multiband system, when a frequency band of 5GNR is used, it is suitable to suppress interference between frequency bands of 4G (LTE: 699-2690 MHz) and a frequency band of WiFi (5150-6000 MHz), which are used in the same mobile communication device. Accordingly, it is desirable that filters that make up a multiplexer that demultiplexes and multiplexes radio frequency signals in the foregoing mobile communication device each has, in addition to a small loss, a wideband attenuation characteristic corresponding to other frequency bands.

According to the foregoing configuration of the multiplexer 1 according to the present embodiment, it becomes possible to form the first pass band of the filter 12, which is caused by the resonant circuit 31, and an attenuation pole in the vicinity of the first pass band, which is caused by a resonant frequency (or an anti-resonant frequency) of the resonant circuit 31, thereby securing steepness in an edge region of the first pass band.

Further, in the filter 12, in a frequency band including the second communication band located in the foregoing other of the higher frequency range above the first communication band and the lower frequency range below the first communication band, the attenuation is secured by forming the first attenuation pole using the resonant circuit 31. Whereas, of the foregoing frequency band including the second communication band, in a frequency band away from the frequency of the first attenuation pole, the attenuation is secured by forming the second attenuation pole using the magnetic coupling between the inductors L1 and L2. That is to say, in the filter 12, at the time of securing an attenuation characteristic in the foregoing wide frequency band including the second communication band, it becomes possible to reduce the number of resonant circuits by not using a plurality of resonant circuits having different resonant frequencies but using the magnetic coupling between the inductors L1 and L2.

Furthermore, a radio frequency signal of the second frequency band group located in the foregoing one of the higher frequency range above the first communication band and the lower frequency range below the first communication band is subjected to processing using the antenna 21, which is different from the antenna 22 connected to the filter 12. This enables to relax the attenuation characteristic of the second frequency band group in the filter 12 and thus enables to eliminate the resonant circuit to be used for securing this attenuation characteristic.

Accordingly, it becomes possible to realize the filter 12 having a steep and wideband attenuation characteristic by using a smaller number of circuit elements and a small-sized multiplexer 1 including this filter 12.

2. Configuration of Multiplexer: First Example to Third Example

Figure 3A:
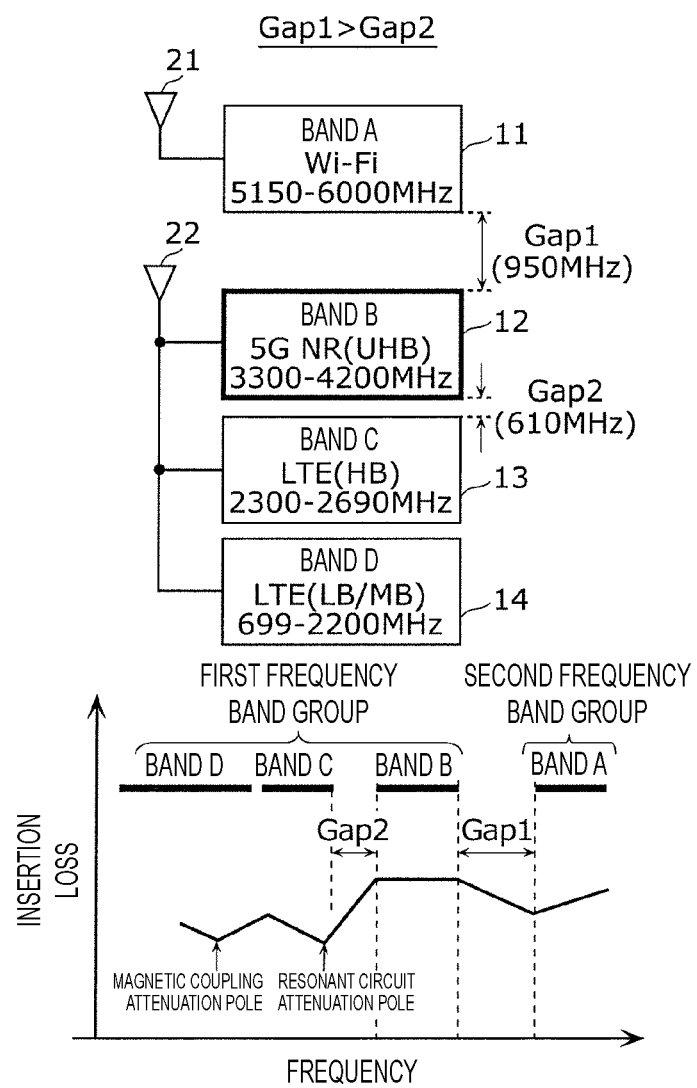
FIG. 3A is a diagram illustrating a first example of a relationship among frequencies of communication bands employed by a multiplexer according to the embodiment.

FIG. 3A is a diagram illustrating a first example of the relationship among frequencies of communication bands employed by the multiplexer 1 according to the embodiment.

In the first example illustrated in FIG. 3A, the antenna 21 is capable of radiating and receiving a radio frequency signal of an unlicensed band (5150-7125 MHz). As the fourth communication band (band A) belonging to the second frequency band group that can be radiated and received by the antenna 21, for example, WiFi (5150-6000 MHz) is employed. Further, the first communication band (band B), the second communication band (band C), and the third communication band (band D) belong to the first frequency band group that can be radiated and received by the antenna 22. As the first communication band (band B), for example, 5GNR (UHB: 3300-4200 MHz) is employed. Further, as the second communication band (band C), for example, HB (2300-2690 MHz) of Long Term Evolution (LTE) is employed. Further, as the third communication band (band D), for example, LB/MB (699-2200 MHz) of LTE is employed.

In the foregoing first example, the second frequency band group is located in a higher frequency range above the first communication band (band B), and the second communication band (band C) is located in a lower frequency range below the first communication band.

Further, a frequency gap Gap1 (950 MHz) between the second frequency band group and the first communication band is greater than a frequency gap Gap2 (610 MHz) between the first communication band and the second communication band.

Note that for another combination of the foregoing first example, as the fourth communication band (band A), for example, WiFi (5150-6000 MHz) is employed, as the first communication band (band B), for example, 5GNR (n78:

3300-3800 MHz) is employed, and as the second communication band (band C), for example, HB (2300-2690 MHz) of LTE is employed.

In the case of the foregoing first example, by employing the filter 12 illustrated in FIG. 2, for example, in a schematic bandpass characteristic of the filter 12 illustrated in a lower section of FIG. 3A, a large attenuation is secured in an attenuation band close to the second communication band (band C), which is in the vicinity of the first communication band (band B), using the first attenuation pole caused by the resonant circuit 31. Whereas a large attenuation is secured in an attenuation band close to the third communication band (band D) by using the second attenuation pole caused by the magnetic coupling between the inductors L1 and L2. That is to say, the attenuation band (second communication band) in the vicinity of the pass band of the filter 12 is formed using the first attenuation pole caused by the resonant circuit 31, and the attenuation band (third communication band) away from the pass band of the filter 12 is formed using the second attenuation pole caused by the magnetic coupling of the inductors L1 and L2. This enables the filter 12 to secure a steep and wideband attenuation characteristic by using a smaller number of circuit elements.

Note that in the first example illustrated in FIG. 3A, a switch may be arranged between the antenna 22 and the filters 12, 13, and 14.

Figure 3B:
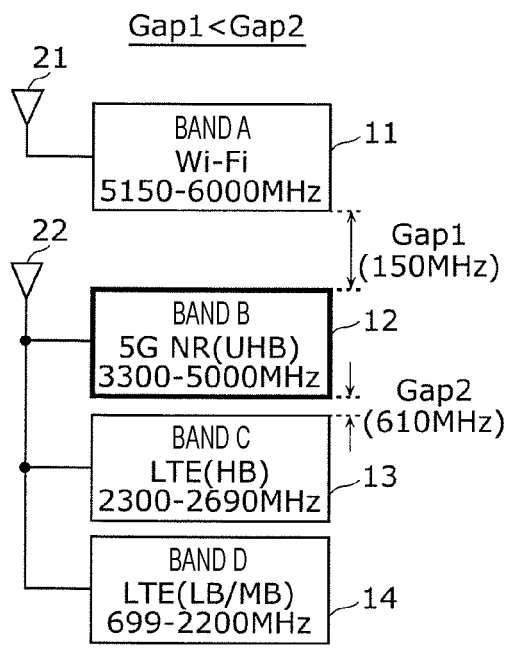
FIGS. 3BA and 3BB are diagrams illustrating a second example and a third example of the relationship among frequencies of communication bands employed by a multiplexer according to the embodiment.
Figure 3B:
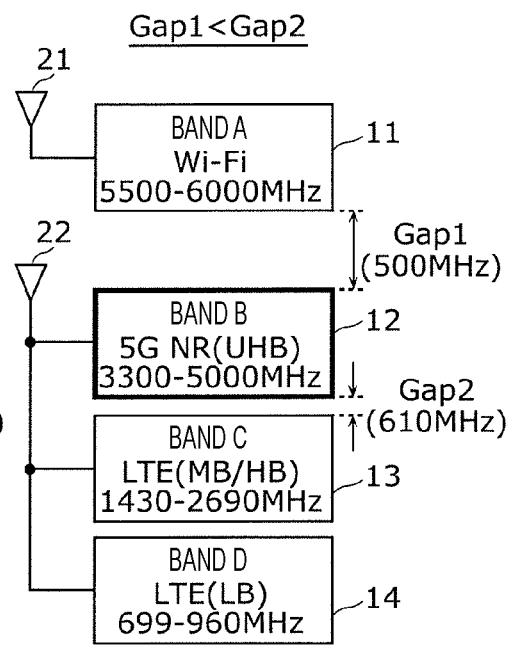
Figure 3B:
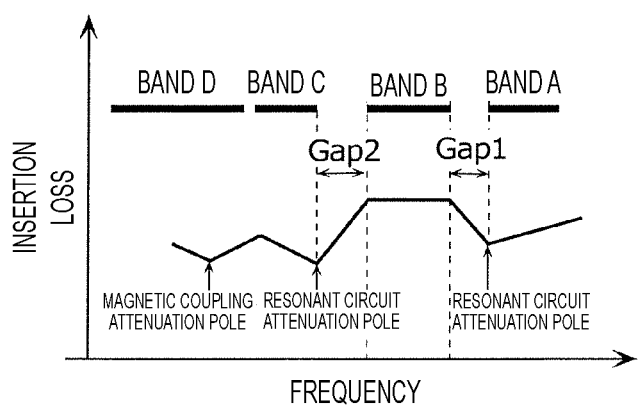

FIGS. 3BA and 3BB are diagrams illustrating a second example (FIG. 3BA) and a third example (FIG. 3BB) of the relationship among frequency bands employed by the multiplexer 1 according to the embodiment. In the second example illustrated in FIG. 3BA, as the fourth communication band (band A) belonging to the second frequency band group, for example, WiFi (5150-6000 MHz) is employed. Further, the first communication band (band B), the second communication band (band C), and the third communication band (band D) belong to the first frequency band group. As the first communication band (band B), for example, 5GNR (UHB: 3300-5000 MHz) is employed. Further, as the second communication band (band C), for example, HB (2300-2690 MHz) of LTE is employed. Further, as the third communication band (band D), for example, LB/MB (699-2200 MHz) of LTE is employed.

Further, in the third example illustrated in FIG. 3BB, as the fourth communication band (band A) belonging to the second frequency band group, for example, WiFi (5500-6000 MHz) is employed. Further, the first communication band (band B), the second communication band (band C), and the third communication band (band D) belong to the first frequency band group. As the first communication band (band B), for example, 5GNR (UHB: 3300-5000 MHz) is employed. Further, as the second communication band (band C), for example, MB/HB (1430-2690 MHz) of LTE is employed. Further, as the third communication band (band D), for example, LB (699-960 MHz) of LTE is employed.

In the second example and the third example, the second frequency band group is located in a higher frequency range above the first communication band (band B), and the second communication band (band C) is located in a lower frequency range below the first communication band.

Further, in the second example, the frequency gap Gap1 (150 MHz) between the second frequency band group and the first communication band is smaller than the frequency gap Gap2 (610 MHz) between the first communication band and the second communication band. Further, in the third example, the frequency gap Gap1 (500 MHz) between the second frequency band group and the first communication band is smaller than the frequency gap Gap2 (610 MHz) between the first communication band and the second communication band. In the cases of the second example and the third example, the frequency gap Gap1 is relatively smaller than the frequency gap Gap2, and thus it is difficult to secure the attenuation characteristic of the second frequency band group in the filter 12 using only isolation between the antenna 21 and the antenna 22.

Whereas, for example, in a schematic bandpass characteristic of the filter 12 illustrated in FIG. 3BC, it becomes possible to secure a steep and wideband attenuation characteristic both in a higher frequency range above the pass band of the filter 12 and a lower frequency range below the pass band of the filter 12 by securing the attenuation in the attenuation band in a higher frequency range above the first communication band (band B) using a third attenuation pole caused by a second resonant circuit.

Note that for other combinations of the foregoing second example and the third example, as the fourth communication band (band A), for example, WiFi (5150-6000 MHz) is employed, as the first communication band (band B), for example, 5GNR (n79: 4400-4600 (or 5000) MHz) is employed, and as the second communication band (band C), for example, 5GNR (n78: 3300-3800 MHz) or MB/HB (1430-2690 MHz) of LTE is employed.

Figure 4A:
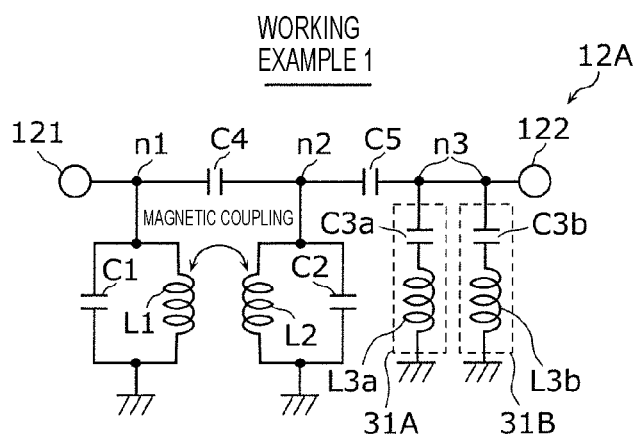
FIG. 4A is a circuit configuration diagram of a first filter that makes up a multiplexer according to a working example 1.

FIG. 4A is a circuit configuration diagram of a filter 12A according to a working example 1 that makes up the multiplexer 1. The filter 12A illustrated in FIG. 4A is a first filter employed in the relationship of frequencies of the communication bands illustrated in the second example and the third example described above. That is to say, the filter 12A is employed in the case where the frequency gap Gap1 between the second frequency band group and the first communication band is smaller than the frequency gap Gap2 between the first communication band and the second communication band.

As illustrated in FIG. 4A, the filter 12A according to the working example 1 includes terminals 121 and 122, resonant circuits 31A and 31B, inductors L1 and L2, and capacitors C1, C2, C4, and C5.

The terminal 121 is connected to the common terminal 102, and the terminal 122 is connected to the input/output terminal 112.

The resonant circuit 31A is the first resonant circuit connected between ground and a node n3 (third node) in a path connecting the terminal 121 and the terminal 122. The resonant circuit 31A forms a LC series resonant circuit in which a capacitor C3a and an inductor L3a are connected in series.

The resonant circuit 31B is the second resonant circuit connected between the ground and a node n3 (third node) in the foregoing path. The resonant circuit 31B forms a LC series resonant circuit in which a capacitor C3b and an inductor L3b are connected in series.

Because the resonant circuits 31A and 31B are the LC series resonant circuits, attenuation poles (the first attenuation pole and the third attenuation pole) corresponding to resonant frequencies of the LC series resonant circuits can be formed in the vicinities of the high frequency side and the low frequency side of the pass band of the filter 12A. Further, the frequency of the foregoing attenuation pole can be adjusted using the inductance value and the capacitance value of the inductor and the capacitor that make up the LC series resonant circuit.

The inductor L1 is the first inductor connected between the ground and a node n1 (first node) in the foregoing path. The inductor L2 is the second inductor connected between the ground and a node n2 (second node) in the foregoing path, which is different from the node n1, and is magnetically coupled with the inductor L1.

The capacitor C1 is connected in parallel to the inductor L1. The capacitor C2 is connected in parallel to the inductor L2.

The capacitor C4 is an impedance element connected between the node n1 and the node n2. The capacitor C5 is an impedance element connected between the node n2 and the node n3.

Here, in the bandpass characteristic of the filter 12A from the common terminal 102 to the input/output terminal 112, the first attenuation pole caused by the resonant circuit 31A and the second attenuation pole caused by the magnetic coupling between the inductors L1 and L2 are formed in an attenuation band closer to the second communication band than the first communication band, and the frequency of the first attenuation pole is closer to the first communication band of the filter 12A (first pass band) than the frequency of the second attenuation pole. Furthermore, the third attenuation pole caused by the resonant circuit 31B is formed in an attenuation band closer to the second frequency band group than the first communication band.

As described above, in the case where the frequency gap Gap1 between the second frequency band group and the first communication band is smaller than the frequency gap Gap2 between the first communication band and the second communication band, it becomes difficult to secure the attenuation characteristic of the second frequency band group in the filter 12A using only isolation between the antenna 21 and the antenna 22. Whereas, according to the filter 12A according to the working example 1, the attenuation is secured in the attenuation band closer to the second frequency band group (higher frequency range) than the first communication band (first pass band) by causing the resonant circuit 31B to form the third attenuation pole. This enables to realize the filter 12A having a steep and wideband attenuation characteristic by using a smaller number of circuit elements in both a higher frequency range above the first communication band and a lower frequency range below the first communication band and a small-sized multiplexer 1 including this filter 12A.

Note that in the filter 12A according to the present working example, the resonant circuits 31A and 31B are connected to the same node n3. Alternatively, the resonant circuits 31A and 31B may be connected to different nodes. That is to say, the resonant circuit 31A may be connected between the ground and the node n3 (third node) in the foregoing path, and the resonant circuit 31B may be connected between the ground and a fourth node in the foregoing path, which is different from the node n3 (third node). Whereas, in the filter 12A according to the present working example, the node n3 (third node) is the same node as the foregoing fourth node. Because the pass band of the filter 12A is a wide band, the first attenuation pole caused by the resonant circuit 31A and the third attenuation pole caused by the resonant circuit 31B are separated from each other with the pass band of the filter 12A interposed therebetween, and thus there is no need to take account of interference between the resonant circuit 31A and the resonant circuit 31B. Accordingly, in the filter 12A according to the present working example, it is optional to arrange an impedance element between the resonant circuit 31A and the resonant circuit 31B, and thus it becomes possible to further reduce the number of circuit elements.

Figure 4B:
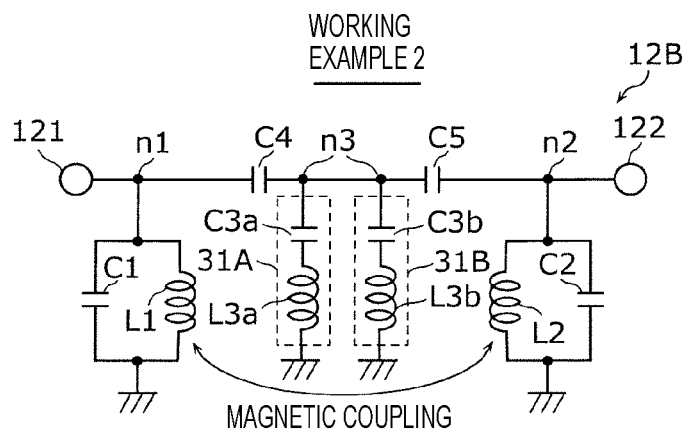
FIG. 4B is a circuit configuration diagram of a first filter that makes up a multiplexer according to a working example 2.

FIG. 4B is a circuit configuration diagram of a filter 12B according to a working example 2 that makes up the multiplexer 1. The filter 12B illustrated in FIG. 4B is the first filter employed in the relationship of frequencies of the communication bands illustrated in the second example and the third example described above. That is to say, the filter 12B is employed in the case where the frequency gap Gap1 between the second frequency band group and the first communication band is smaller than the frequency gap Gap2 between the first communication band and the second communication band.

As illustrated in FIG. 4B, the filter 12B according to the working example 2 includes a terminal 121 (first terminal), a terminal 122 (second terminal), a resonant circuit 31A (first resonant circuit), a resonant circuit 31B (second resonant circuit), an inductor L1 (first inductor), an inductor L2 (second inductor), and capacitors C1, C2, C4, and C5. The filter 12B according to the working example 2 is different from the filter 12A according to the working example 1 in the connection position of the resonant circuits 31A and 31B. Hereinafter, the filter 12B according to the working example 2 is described with the emphasis on the configuration different from the filter 12A according to the working example 1 while omitting the description regarding the same circuit configuration.

The nodes n3 to which the resonant circuits 31A and 31B are connected are located between the node n1 to which the inductor L1 and the node n2 to which the inductor L2 is connected in the foregoing path. That is to say, the resonant circuits 31A and 31B are arranged between the inductor L1 and the inductor L2.

That is to say, the filter 12B according to the working example 2 includes the first terminal and the second terminal, the first inductor (inductor L1) connected between the ground and the first node (node n1) in the path connecting the first terminal and the second terminal, the second inductor (inductor L2) that is connected between the ground and the second node (node n2) in the foregoing path, which is different from the first node, and magnetically coupled with the first inductor, the first resonant circuit (resonant circuit 31A) connected between the ground and the third node (node n3) located between the first node and the second node in the foregoing path, and the second resonant circuit (resonant circuit 31B) connected between the ground and the third node, wherein the first resonant circuit and the second resonant circuit are each a LC series resonant circuit.

Figure 4C:
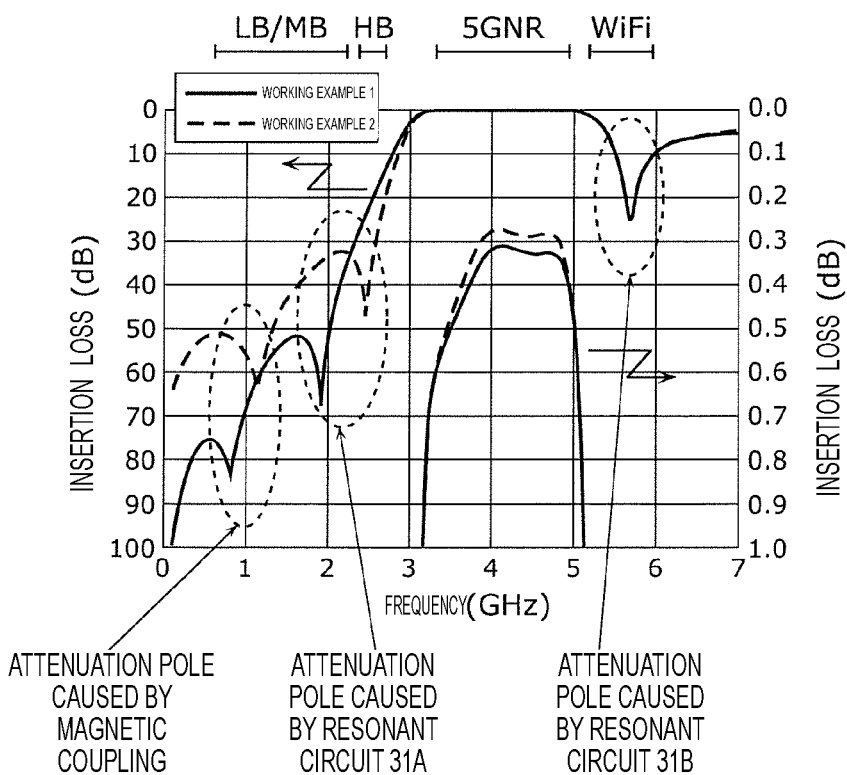
FIG. 4C is a graph that compares bandpass characteristics of the first filters according to the working example 1 and the working example 2.

FIG. 4C is a graph that compares bandpass characteristics of the filter 12A according to the working example 1 and the filter 12B according to the working example 2. As illustrated in FIG. 4C, in both the filter 12A according to the working example 1 and the filter 12B according to the working example 2, the insertion loss in the first communication band (5GNR) is less than or equal to 1.0 dB and achieves a small loss. Further, the attenuation characteristic in the second communication band (HB) is secured by the first attenuation pole caused by the resonant circuit 31A, and the attenuation characteristic in the third communication band (LB/MB) is secured by the second attenuation pole caused by the magnetic coupling between the inductors L1 and L2. Furthermore, the attenuation characteristic in the second frequency band group (WiFi) is secured by the third attenuation pole caused by the resonant circuit 31B.

That is to say, in both the filter 12A according to the working example 1 and the filter 12B according to the working example 2, the insertion loss within the first pass band is small, and a large attenuation is secured in a wide attenuation band in a lower frequency range below the first pass band and in an attenuation band in a higher frequency range above the first pass band.

However, the filter 12B according to the working example 2 has a smaller insertion loss in the first pass band and a higher steepness (attenuation characteristic) in the vicinity of the low frequency side of the first pass band. In the following section, a difference of the foregoing characteristics of the filters 12A and 12B is described.

Figure 5A:
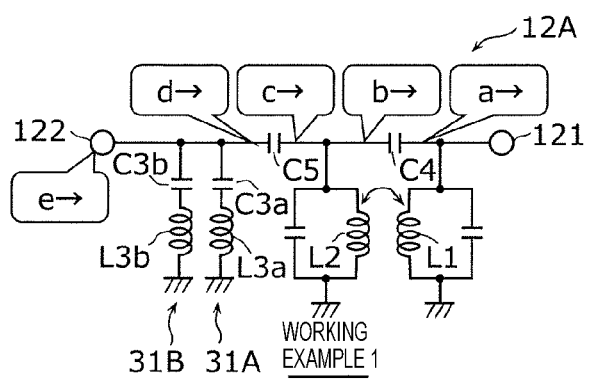
FIG. 5A is a circuit configuration diagram of a first filter according to the working example 1.
Figure 5B:
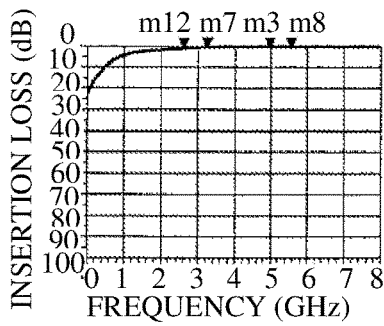
FIGS. 5BA-5BF include graphs illustrating bandpass characteristics and Smith charts at respective nodes of the first filter according to the working example 1.
Figure 5B:
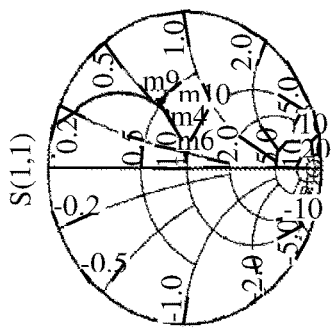
Figure 5B:
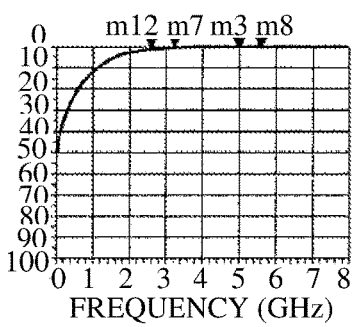
Figure 5B:
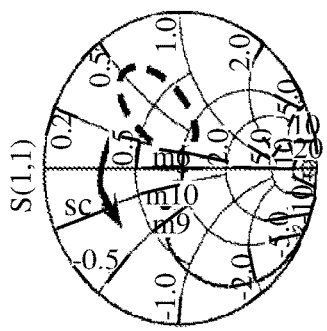
Figure 5B:
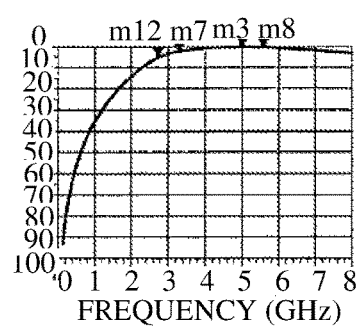
Figure 5B:
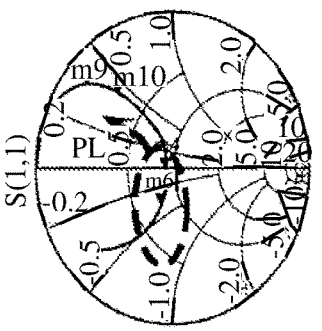
Figure 5B:
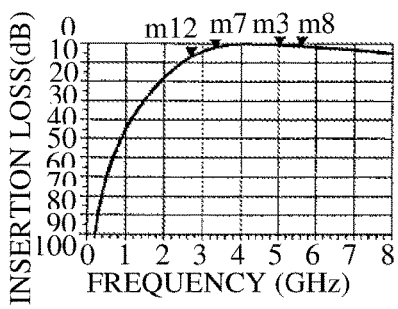
Figure 5B:
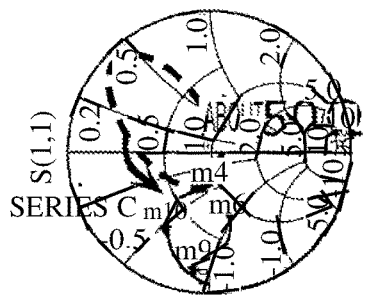
Figure 5B:
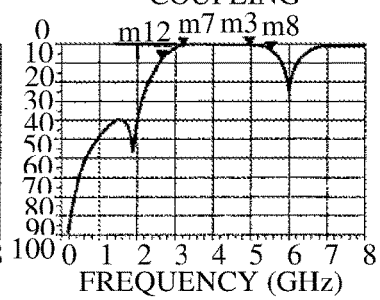
Figure 5B:
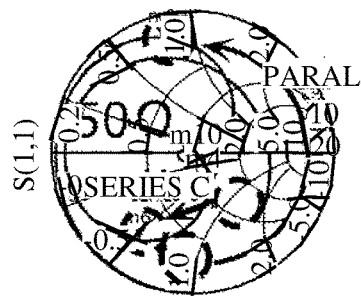
Figure 5B:
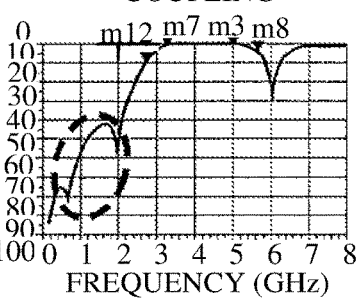
Figure 5B:
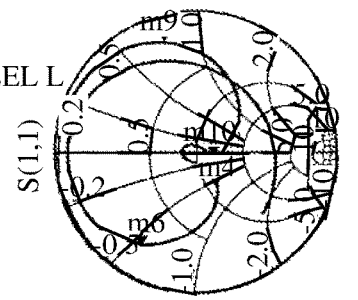

FIG. 5A is a circuit configuration diagram of a first filter according to the working example 1. FIGS. 5BA-5BF include graphs illustrating bandpass characteristics and Smith charts at respective nodes of the filter 12A according to the working example 1. In FIGS. 5BA-5BF, each of 5BA, 5BB, 5BC, 5BD, and 5BE (and 5BF) illustrates the bandpass characteristic between the terminal 121 and each of nodes a, b, c, d, and e of the filter 12A illustrated in FIG. 5A, and the Smith chart illustrating the impedance looking from each of the nodes a, b, c, d, and e to the terminal 121 side.

First, in FIG. 5BA, the impedance in DC to 8 GHz of the inductor L1 connected in parallel to the node a appears along a circle of constant conductance of the Smith chart.

Next, in FIG. 5BB, at the node b, the capacitor C4 connected in series to the node a (indicated as SC in the Smith chart) is added, and thus the impedance looking from the node b to the terminal 121 side shifts in the counterclockwise direction along a circle of constant resistance of the Smith chart.

Next, in FIG. 5BC, at the node c, the inductor L2 connected in parallel to the node b (indicated as PL in the Smith chart) is added, and thus the impedance looking from the node c to the terminal 121 side shifts in the counterclockwise direction along a circle of constant conductance of the Smith chart.

Next, in FIG. 5BD, at the node d, the capacitor C5 connected in series to the node c is added, and thus the impedance looking from the node d to the terminal 121 side shifts in the counterclockwise direction along a circle of constant resistance of the Smith chart. At this time, the foregoing impedance is shifting while securing the impedance in the first pass band of the filter 12A at about 50Ω, and thus the impedance in the attenuation band does not shift to an outer edge of the Smith chart (reflection coefficient is small).

Next, in FIG. 5BE, at the node e, the resonant circuits 31A and 31B connected in parallel to the node d are added, and thus the impedance in a lower frequency range below the first pass band is affected by the inductors L1 and L2 connected in parallel and shifts in the counterclockwise direction along a circle of constant conductance of the Smith chart. Whereas the impedance in a higher frequency range above the first pass band is affected by the capacitors C1 and C2 connected in parallel and shifts in the clockwise direction along a circle of constant conductance of the Smith chart. At this time, in the bandpass characteristic, the first attenuation pole caused by the resonant circuit 31A is formed in the vicinity of a low frequency side of the first pass band, and the third attenuation pole caused by the resonant circuit 31B is formed in the vicinity of a high frequency side of the first pass band. However, the impedances in the vicinities of the foregoing low frequency and the foregoing high frequency are shifting while securing the impedance in the first pass band of the filter 12A at 50Ω, and thus the impedances in the vicinities of the foregoing low frequency and the foregoing high frequency do not shift to the outer edge of the Smith chart (reflection coefficient is small).

Note that in FIG. 5BF, it is illustrated that the second attenuation pole is formed by magnetically coupling the inductors L1 and L2 in addition to FIG. 5BE. However, this magnetic coupling does not change the reflection coefficient due to the impedance.

As described above, in the filter 12A according to the working example 1, at each node, the impedance in the attenuation band is shifted to the outer circumferential of the Smith chart while keeping the impedance in the first pass band at substantially 50Ω. Because of this, the impedance in the attenuation band could not be fully shifted to the outer edge of the Smith chart.

Figure 6A:
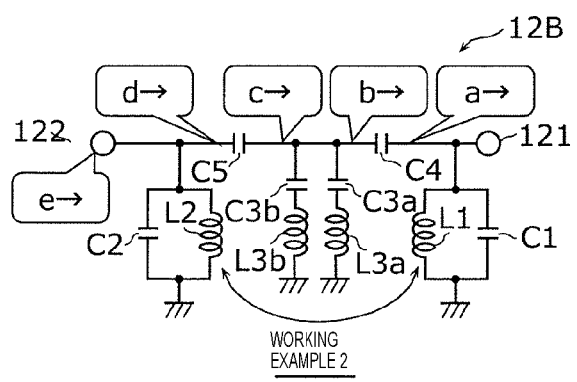
FIG. 6A is a circuit configuration diagram of a first filter according to the working example 2.
Figure 6B:
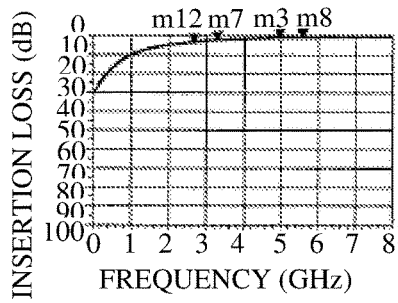
FIGS. 6BA-6BF include graphs illustrating bandpass characteristics and Smith charts at respective nodes of the first filter according to the working example 2.
Figure 6B:
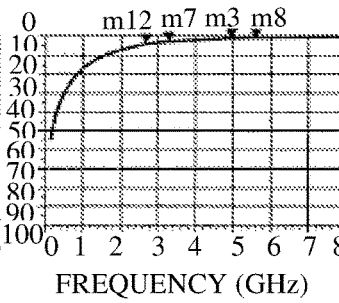
Figure 6B:
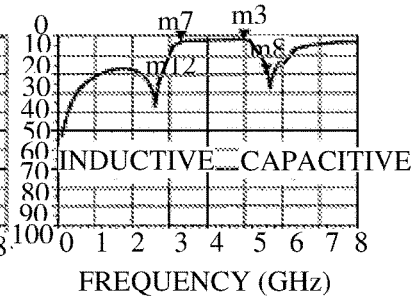
Figure 6B:
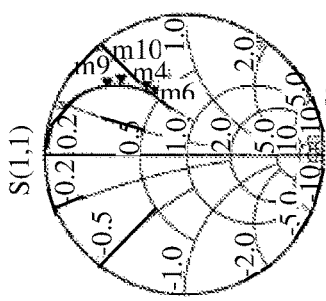
Figure 6B:
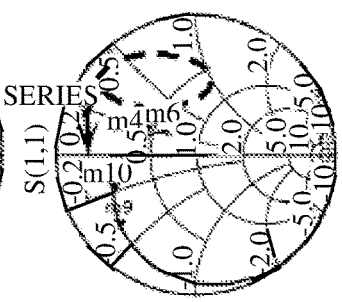
Figure 6B:
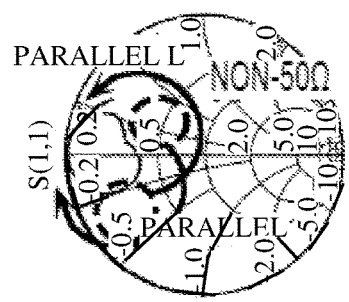
Figure 6B:
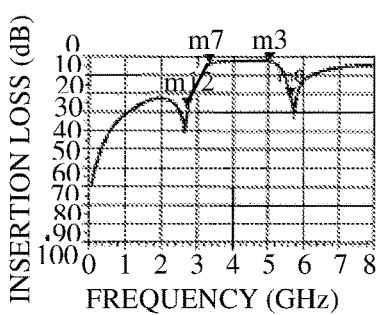
Figure 6B:
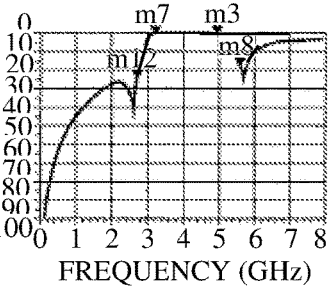
Figure 6B:
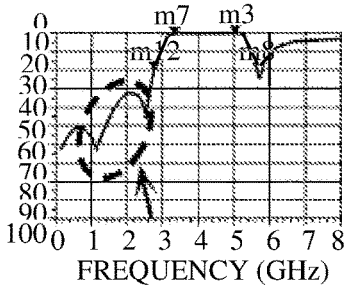
Figure 6B:
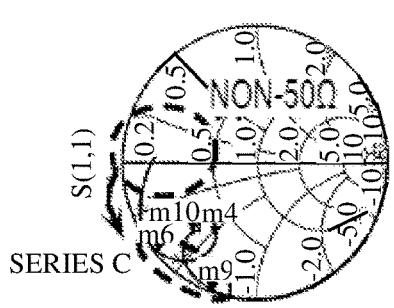
Figure 6B:
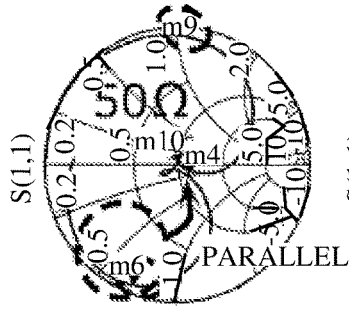
Figure 6B:
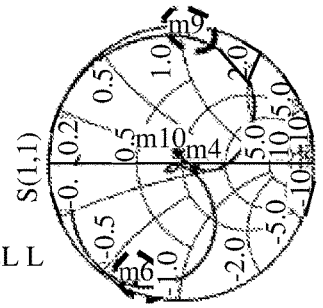

FIG. 6A is a circuit configuration diagram of a first filter according to the working example 2. FIGS. 6BA-6BF include graphs illustrating bandpass characteristics and Smith charts at respective nodes of the filter 12B according to the working example 2. In FIGS. 6BA-6BF, each of 6BA, 6BB, 6BC, 6BD, and 6BE (and 6BF) illustrates the bandpass characteristic between the terminal 121 and each of nodes a, b, c, d, and e of the filter 12B illustrated in FIG. 6A, and the Smith chart illustrating the impedance looking from each of the nodes a, b, c, d, and e to the terminal 121 side.

First, in FIG. 6BA, the impedance in DC to 8 GHz of the inductor L1 connected in parallel to the node a appears along a circle of constant conductance of the Smith chart.

Next, in FIG. 6BB, at the node b, the capacitor C4 connected in series to the node a is added, and thus the impedance looking from the node b to the terminal 121 side shifts in the counterclockwise direction along a circle of constant resistance of the Smith chart.

Next, in FIG. 6BC, at the node c, the resonant circuits 31A and 31B connected in parallel to the node b are added, and thus the impedance in a lower frequency range below the first pass band is affected by the inductors L1 and L2 connected in parallel and shifts in the counterclockwise direction along a circle of constant conductance of the Smith chart. Whereas the impedance in a higher frequency range above the first pass band is affected by the capacitors C1 and C2 connected in parallel and shifts in the clockwise direction along a circle of constant conductance of the Smith chart. At this time, in the bandpass characteristic, the first attenuation pole caused by the resonant circuit 31A is formed in the vicinity of a low frequency side of the first pass band, and the third attenuation pole caused by the resonant circuit 31B is formed in the vicinity of a high frequency side of the first pass band. However, the impedances in the vicinities of the foregoing low frequency and the foregoing high frequency do not keep the impedance of the filter 12B in the first pass band at 50Ω (denoted as non-50Ω). This enables to shift the impedances in the vicinities of the foregoing low frequency and the foregoing high frequency to the outer edge of the Smith chart (reflection coefficient is large). Note that in this stage, the impedance in the first pass band is set to non-50Ω, and thus the insertion loss within the first pass band is worsening.

Next, in FIG. 6BD, at the node d, the capacitor C5 connected in series to the node c is added, and thus the impedance looking from the node d to the terminal 121 side shifts in the counterclockwise direction along a circle of constant resistance of the Smith chart. At this time, the foregoing impedance does not keep the impedance of the filter 12B in the first pass band at 50Ω (denoted as non-50Ω). This causes the impedances in the vicinities of the foregoing low frequency and the foregoing high frequency to be at the outer edge of the Smith chart (reflection coefficient is large).

Next, in FIG. 6BE, at the node e, the inductor L2 connected in parallel to the node d is added, and thus the impedance looking from the node e to the terminal 121 side shifts in the counterclockwise direction along a circle of constant conductance of the Smith chart. At this time, the impedance in the first pass band of the filter 12B is brought back from non-50Ω to 50Ω while keeping the impedances in the vicinities of the foregoing low frequency and the foregoing high frequency at the outer edge of the Smith chart.

Note that in FIG. 6BF, it is illustrated that the second attenuation pole is formed by magnetically coupling the inductors L1 and L2 in addition to FIG. 6BE. However, this magnetic coupling does not change the reflection coefficient in the impedance.

As described above, in the filter 12B according to the working example 2, the circuit configuration is such that the resonant circuits 31A and 31B are arranged between the inductor L1 and the inductor L2, and thus the impedance matching with an external circuit connected to the terminals 121 and 122 can be achieved using the inductors L1 and L2. This enables the adjustments of impedances of the attenuation band (the first attenuation pole and the third attenuation pole) formed by the resonant circuits 31A and 31B and the first pass band independently of the impedance matching with the external circuit. As a result, flexibility in adjusting the impedances of the foregoing attenuation band and the first pass band is improved, and this enables to reduce the loss and increase the attenuation in the filter 12B.

Note that also in the filter 12 according to the embodiment illustrated in FIG. 2, a circuit configuration in which the resonant circuit 31 can be arranged between the inductor L1 and the inductor L2. That is to say, in the filter 12 illustrated in FIG. 2, the node n3 to which the resonant circuit 31 is connected can be located between the node n1 to which the inductor L1 is connected and the node n2 to which the inductor L2 is connected in the path connecting the terminal 121 and the terminal 122. According to this, the impedance matching with an external circuit connected to the terminals 121 and 122 can be achieved using the inductors L1 and L2. This enables the adjustments of impedances of the attenuation band (the first attenuation pole) formed by the resonant circuit 31 and the first pass band independently of the impedance matching with the external circuit, and thus flexibility in adjusting the impedances of the foregoing attenuation band and the first pass band is improved, and this enables to reduce the loss and increase the attenuation in the filter 12.

3. Configuration of Multiplexer: Fourth Example

Figure 7A:
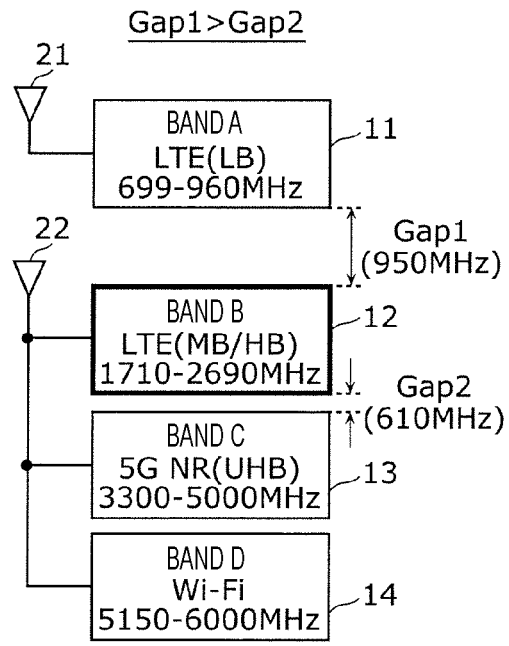
FIG. 7A is a diagram illustrating a fourth example of the relationship among frequency bands employed by a multiplexer according to the embodiment.

FIG. 7A is a diagram illustrating a fourth example of the relationship among frequency bands employed by the multiplexer 1 according to the embodiment. In the fourth example illustrated in FIG. 7A, as the fourth communication band (band A) belonging to the second frequency band group, for example, LB (699-960 MHz) of LTE is employed. Further, the first communication band (band B), the second communication band (band C), and the third communication band (band D) belong to the first frequency band group. As the first communication band (band B), for example, MB/HB (1710-2690 MHz) of LTE is employed. Further, as the second communication band (band C), for example, 5GNR (UHB: 3300-5000 MHz) is employed. Further, as the third communication band (band D), for example, of the unlicensed band (5150-7125 MHz), WiFi (5150-6000 MHz) is employed.

In the foregoing fourth example, the second frequency band group is located in a lower frequency range below the first communication band (band B), and the second communication band (band C) is located in a higher frequency range above the first communication band.

Further, in the fourth example, the frequency gap Gap1 (950 MHz) between the second frequency band group and the first communication band is larger than the frequency gap Gap2 (610 MHz) between the first communication band and the second communication band.

In the foregoing fourth example, as the filter 12 that makes up the multiplexer 1, the filter 12A according to the working example 1 and the filter 12B according to the working example 2 are employed. Note that in this case, the filters 12A and 12B employed by the fourth example are different from the filters 12A and 12B employed by the first example to the third example in the capacitance values and the inductance values of circuit elements that make up the filters 12A and 12B and in the coefficient of magnetic coupling between the inductors L1 and L2.

Figure 7B:
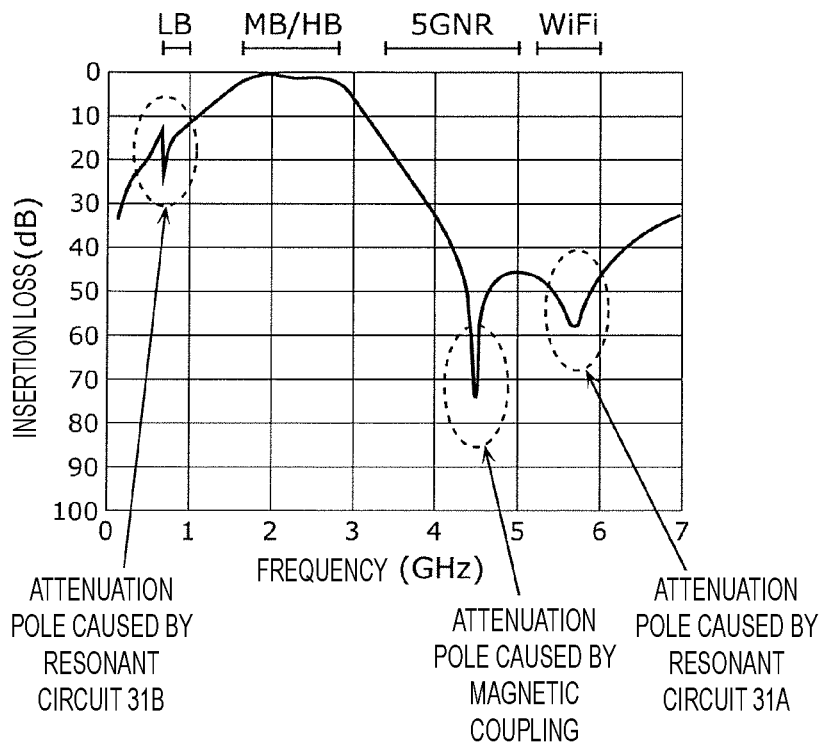
FIG. 7B is a graph illustrating a bandpass characteristic of the first filter employed by the fourth example.

FIG. 7B is a graph illustrating the bandpass characteristic of the filter 12B employed by the fourth example. FIG. 7B illustrates the bandpass characteristic in the case where the filter 12B is employed as the first filter in the relationship of frequencies illustrated in the fourth example.

As illustrated in FIG. 7B, for the filter 12B employed by the fourth example, a small loss is secured in the first communication band (MB/HB). Further, the attenuation characteristic in the second communication band (5GNR) is secured by the second attenuation pole caused by the magnetic coupling between the inductors L1 and L2, and the attenuation characteristic in the third communication band (WiFi) is secured by the first attenuation pole caused by the resonant circuit 31A. Furthermore, the attenuation characteristic in the second frequency band group (LB) is secured by the third attenuation pole caused by the resonant circuit 31B.

That is to say, in the filter 12B employed by the fourth example, the insertion loss within the first pass band is small, and a large attenuation is secured in a wide attenuation band in a higher frequency range above the first pass band and in an attenuation band in a lower frequency range below the first pass band. According to this, in the filter 12B, when securing an attenuation characteristic in the foregoing wide frequency band including the second communication band, it becomes possible to reduce the number of resonant circuits by not using a plurality of resonant circuits having different resonant frequencies but using the magnetic coupling between the inductors L1 and L2. This enables the filter 12B to secure a steep and wideband attenuation characteristic by using a smaller number of circuit elements.

Note that in the present example, Gap1>Gap2. Thus, the resonant circuit 31b may be omitted. Even in this case, the isolation between the antenna 21 and the antenna 22 enables to secure a sufficient attenuation in the attenuation band in a lower frequency range below the first pass band. However, in the case where the resonant circuit 31B is included as in the circuit configuration of the present modified example, the third attenuation pole caused by the resonant circuit 31B is more effective when Gap1<Gap2.

4. First Filter Including Acoustic Wave Resonator

In the previous section, it is described that the resonant circuit included in the first filter that makes up the multiplexer 1 is a LC series resonant circuit. Alternatively, the resonant circuit may be a circuit including an acoustic wave resonator.

Figure 8:
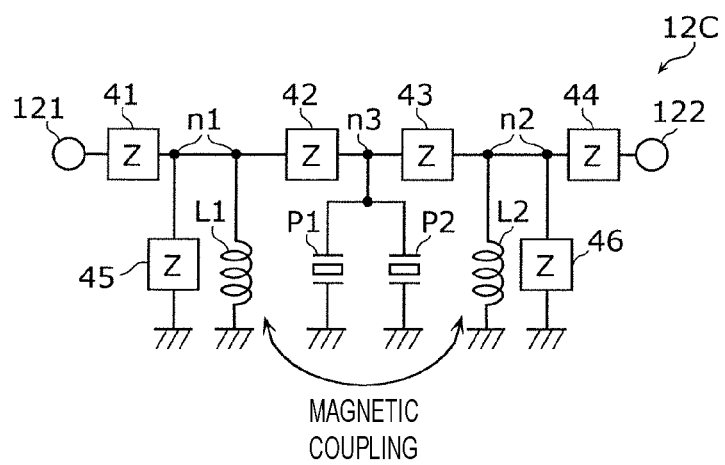
FIG. 8 is a circuit configuration diagram of a first filter according to a modified example 1 of the embodiment.

FIG. 8 is a circuit configuration diagram of a filter 12C according to a modified example 1 of the embodiment. The filter 12C illustrated in FIG. 8 is employed as the first filter that makes up the multiplexer 1. The filter 12C according to the modified example 1 includes terminals 121 and 122, parallel arm resonators P1 and P2, inductors L1 and L2, and impedance elements 41, 42, 43, 44, 45, and 46. The filter 12C according to the modified example 1 is different from the filter 12B according to the working example 2 in that the parallel arm resonators P1 and P2 are arranged in place of the resonant circuits 31A and 31B and in that the impedance elements are arranged in place of the capacitors. Hereinafter, the filter 12C according to the modified example 1 is described with the emphasis on the configuration different from the filter 12B according to the working example 2 while omitting the description regarding the same circuit configuration.

The parallel arm resonator P1 is the first resonant circuit connected between ground and a node n3 (third node) in a path connecting the terminal 121 and the terminal 122. The parallel arm resonator P1 is made up of an acoustic wave resonator.

The parallel arm resonator P2 is the second resonant circuit connected between the ground and the node n3 (third node) in the foregoing path. The parallel arm resonator P2 is made up of an acoustic wave resonator.

The impedance element 41 is connected between the terminal 121 and a node n1, the impedance element 42 is connected between a node n1 and a node n3, the impedance element 43 is connected between a node n2 and the node n3, and the impedance element 44 is connected between the terminal 122 and a node n2. Further, the impedance element 45 is connected between the node n1 and the ground, and the impedance element 46 is connected between the node n2 and the ground.

According to the foregoing configuration, the first attenuation pole and the third attenuation pole corresponding to resonant frequencies of the parallel arm resonators P1 and P2 can be formed in the vicinities of the high frequency side and the low frequency side of the pass band of the filter 12C. Further, the filter 12C according to the present modified example can be employed in the case where the pass band is narrow.

5. Band Variable Type First Filter

The first filter employed by the multiplexer 1 according to the present embodiment may alternatively be a so-called tunable filter in which the frequencies of a pass band and an attenuation band can be changed.

Figure 9A:
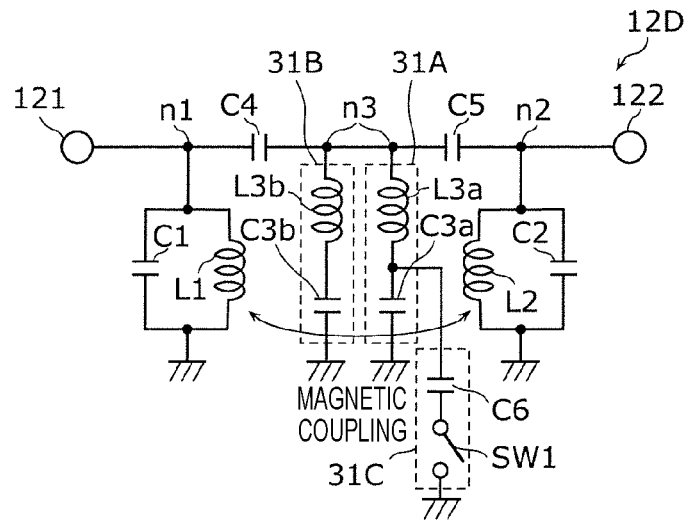
FIG. 9A is a circuit configuration diagram of a first filter according to a modified example 2 of the embodiment.

FIG. 9A is a circuit configuration diagram of a filter 12D according to a modified example 2 of the embodiment. The filter 12D illustrated in FIG. 8 is employed as the first filter that makes up the multiplexer 1. The filter 12D according to the modified example 2 includes terminals 121 and 122, resonant circuits 31A and 31B, a frequency variable circuit 31C, inductors L1 and L2, and capacitors C1, C2, C4, and C5. The filter 12D according to the modified example 2 is different from the filter 12B according to the working example 2 in that the frequency variable circuit 31C is added. Hereinafter, the filter 12D according to the modified example 2 is described with the emphasis on the configuration different from the filter 12B according to the working example 2 while omitting the description regarding the same circuit configuration.

The frequency variable circuit 31C includes a capacitor C6 and a switch SW1. The circuit in which the capacitor C6 and the switch SW1 are connected in series to each other is connected between the ground and a connection node between an inductor L3a and a capacitor C3a.

According to the foregoing configuration, when the switch SW1 is in the non-conductive state, a resonant frequency of the resonant circuit 31A is determined by LC series resonance of the inductor L3a and the capacitor C3a. Whereas, when the switch SW1 is in the conductive state, a resonant frequency of the resonant circuit 31A is determined by LC series resonance of the inductor L3a and the capacitors C3a and C6. That is to say, the switch SW1 is a switching element to enable a change in the resonant frequency of the resonant circuit 31A, and the frequency of the first attenuation pole determined by the resonant frequency of the resonant circuit 31A can be changed by switching the switch SW1.

Figure 9B:
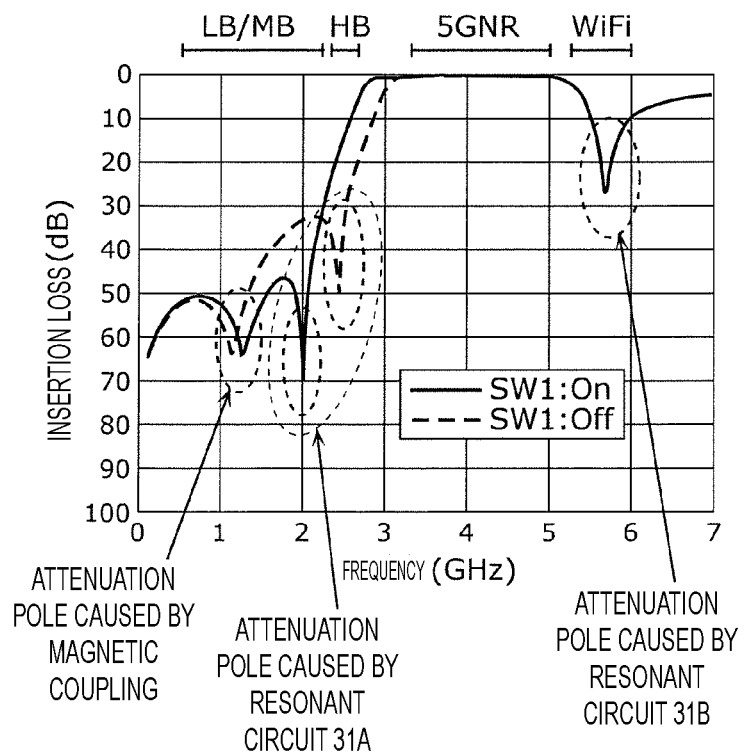
FIG. 9B is a graph illustrating a bandpass characteristic of the first filter according to the modified example 2 of the embodiment.

FIG. 9B is a graph illustrating a bandpass characteristic of the filter 12D according to the modified example 2 of the embodiment. As illustrated in FIG. 9B, in the filter 12D according to the modified example 2, the insertion loss in the first communication band (5GNR) is less than or equal to 1.0 dB and achieves a small loss. Further, the attenuation characteristic in the second communication band (HB) is secured by the first attenuation pole caused by the resonant circuit 31A, the attenuation characteristic in the third communication band (LB/MB) is secured by the second attenuation pole caused by the magnetic coupling between the inductors L1 and L2, and the attenuation characteristic in the second frequency band group (WiFi) is secured by the third attenuation pole caused by the resonant circuit 31B.

That is to say, in the filter 12D according to the modified example 2, the insertion loss within the first pass band is small, and a large attenuation is secured in a wide attenuation band in a lower frequency range below the first pass band and in an attenuation band in a higher frequency range above the first pass band.

Furthermore, by setting the switch SW1 to the conductive state, the first attenuation pole caused by the resonant circuit 31A shifts to the low frequency side. This causes the attenuation characteristic in the second communication band (HB) to change and enables to reduce the insertion loss in a low frequency edge part of the first pass band. According to this, for example, when the first communication band and the second communication band (one of bands on the high frequency side) are used simultaneously, isolation between two radio frequency signals to be used simultaneously is secured by setting the switch SW1 to the non-conductive state. Whereas, when the first communication band (one of bands on the low frequency side) and the second communication band (one of bands on the low frequency side) or the third communication band are used simultaneously, it becomes possible to reduce the insertion loss of a radio frequency signal of the first communication band (one of bands on the low frequency side) by setting the switch SW1 to the conductive state. That is to say, because the attenuation pole and the pass band of the filter 12D can be changed in response to the switching combinations of communication bands to be simultaneously used, it becomes possible to realize low-loss carrier aggregation compatible with the combinations of the communication bands.

6. Diplexer Including First Filter

A multiplexer according to the present modified example has a configuration in which a third filter and a fourth filter for further demultiplexing and multiplexing of the first communication band are connected to the first filter in a cascade fashion.

FIG. 10AA-10AC include diagrams illustrating a circuit configuration and a relationship among frequency bands employed by a multiplexer according to a modified example 3 of the embodiment. The multiplexer according to the present modified example includes common terminals 101 and 102, input/output terminals 111, 112, 113, 114, 141, and 142, filters 11, 12, 13, 14, 51, and 52. The multiplexer according to the modified example 3 is different from the multiplexer 1 according to the embodiment in that the filters 51 and 52 are included. Hereinafter, the multiplexer according to the modified example 3 is described with the emphasis on the configuration different from the multiplexer 1 according to the embodiment while omitting the description regarding the same circuit configuration.

FIG. 10AA is a diagram illustrating a fifth example of the relationship among frequencies of communication bands employed by a multiplexer according to the present modified example. In the fifth example illustrated in FIG. 10AA, as the fourth communication band (band A) belonging to the second frequency band group that can be radiated and received by the antenna 21, for example, WiFi (5150-6000 MHz) is employed. Further, the first communication band (band B), the second communication band (band C), and the third communication band (band D) belong to the first frequency band group that can be radiated and received by the antenna 22. As the first communication band (band B), for example, 5GNR (UHB: 3300-5000 Hz) is employed. Further, as the second communication band (band C), for example, HB (2300-2690 MHz) of LTE is employed. Further, as the third communication band (band D), for example, LB/MB (699-2200 MHz) of LTE is employed.

Furthermore, the first communication band (band B) is divided into band B1 (n79: 4400-5000 Hz) and band B2 (n78: 3300-3800 Hz).

The filter 11 is connected to the common terminal 101 at one end and connected to the input/output terminal 111 at the other end and is a filter whose pass band is the fourth communication band. The filter 12 is connected to the common terminal 102 at one end and connected to the input/output terminal 112 (first input/output terminal) at the other end and is the first filter in which the first pass band is the first communication band. The filter 13 is connected to the common terminal 102 at one end and connected to the input/output terminal 113 (second input/output terminal) at the other end and is the second filter in which the second pass band is the second communication band. The filter 14 is connected to the common terminal 102 at one end and connected to the input/output terminal 114 at the other end and is a filter whose pass band is the third communication band.

The filter 51 is connected to the input/output terminal 112 (first input/output terminal) at one end and connected to the input/output terminal 141 at the other end and is the fourth filter whose pass band is Band n79 of 5GNR. The filter 52 is connected to the input/output terminal 112 (first input/output terminal) at one end and connected to the input/output terminal 142 at the other end and is the third filter whose pass band is Band n78 of 5GNR.

The input/output terminals 141 and 142 are, for example, connected to the FE circuit 62 (illustrated in FIG. 1). Note that a switch or the like may be arranged between the input/output terminals 141 and 142 and the FE circuit 62.

According to the foregoing configuration, the filter 12, the filter 51, and the filter 52 make up a diplexer 50 that demultiplexes and multiplexes 5GNR (first communication band) to and from Band n78 and Band n79.

The filter 51 includes, as illustrated in FIG. 10AC, terminals 511 and 512, inductors L7, L8a, and L8b, and capacitors C7, C8a, C8b, C9, and C10.

The terminal 511 is connected to the input/output terminal 112. A LC series resonant circuit, in which the inductor L7 and the capacitor C7 are connected in series to each other, is connected between the ground and a node n1 in a path connecting the terminal 511 and the terminal 512. A LC series resonant circuit, in which the inductor L8a and the capacitor C8a are connected in series to each other, is connected between the ground and a node n2 in the foregoing path. A LC series resonant circuit, in which the inductor L8b and the capacitor C8b are connected in series to each other, is connected between the ground and a node n2 in the foregoing path. The capacitor C9 is connected between the terminal 511 and the node n1, and the capacitor C10 is connected between the node n1 and the node n2. According to the foregoing circuit configuration, the filter 51 makes up a LC filter whose pass band is Band n79.

Note that in the filter 51, the LC series resonant circuit made up of the inductor L8a and the capacitor C8a and the LC series resonant circuit made up of the inductor L8b and the capacitor C8b are connected to the same node n2. This is because, since the pass band of the filter 51 is a wide band (n79: 600 MHz) and the attenuation poles caused by the foregoing two LC series resonant circuits are located away from each other with the wide pass band interposed therebetween, there is no need to take account of interference between the foregoing two LC series resonant circuits. Accordingly, in the filter 51, it is optional to arrange an impedance element between the foregoing two LC series resonant circuits, and this enables to reduce the number of circuit elements.

The filter 52 includes, as illustrated in FIG. 10AC, terminals 521 and 522, inductors L11, L12a, L12b, L13, and L14, and capacitors C11, C12a, C12b, C13, and C14.

The terminal 521 is connected to the input/output terminal 112. A LC series resonant circuit, in which the inductor L11 and the capacitor C11 are connected in series to each other, is connected between the ground and a node n1 in a path connecting the terminal 521 and the terminal 522. A LC series resonant circuit, in which the inductor L12a and the capacitor C12a are connected in series to each other, is connected between the ground and a node n2 in the foregoing path. A LC series resonant circuit, in which the inductor L12b and the capacitor C12b are connected in series to each other, is connected between the ground and a node n2 in the foregoing path. A parallel connection circuit of the inductor L13 and capacitor C13 is connected between the terminal 521 and the node n1, and a parallel connection circuit of the inductor L14 and capacitor C14 is connected between the node n1 and the node n2. According to the foregoing circuit configuration, the filter 52 makes up a LC filter whose pass band is Band n78.

Note that in the filter 52, the LC series resonant circuit made up of the inductor L12a and the capacitor C12a and the LC series resonant circuit made up of the inductor L12b and the capacitor C12b are connected to the same node n2. This is because, since the pass band of the filter 52 is a wide band (n78: 500 MHz) and the attenuation poles caused by the foregoing two LC series resonant circuits are located away from each other with the wide pass band interposed therebetween, there is no need to take account of interference between the foregoing two LC series resonant circuits. Accordingly, in the filter 52, it is optional to arrange an impedance element between the foregoing two LC series resonant circuits, and thus it becomes possible to reduce the number of circuit elements.

Figure 10B:
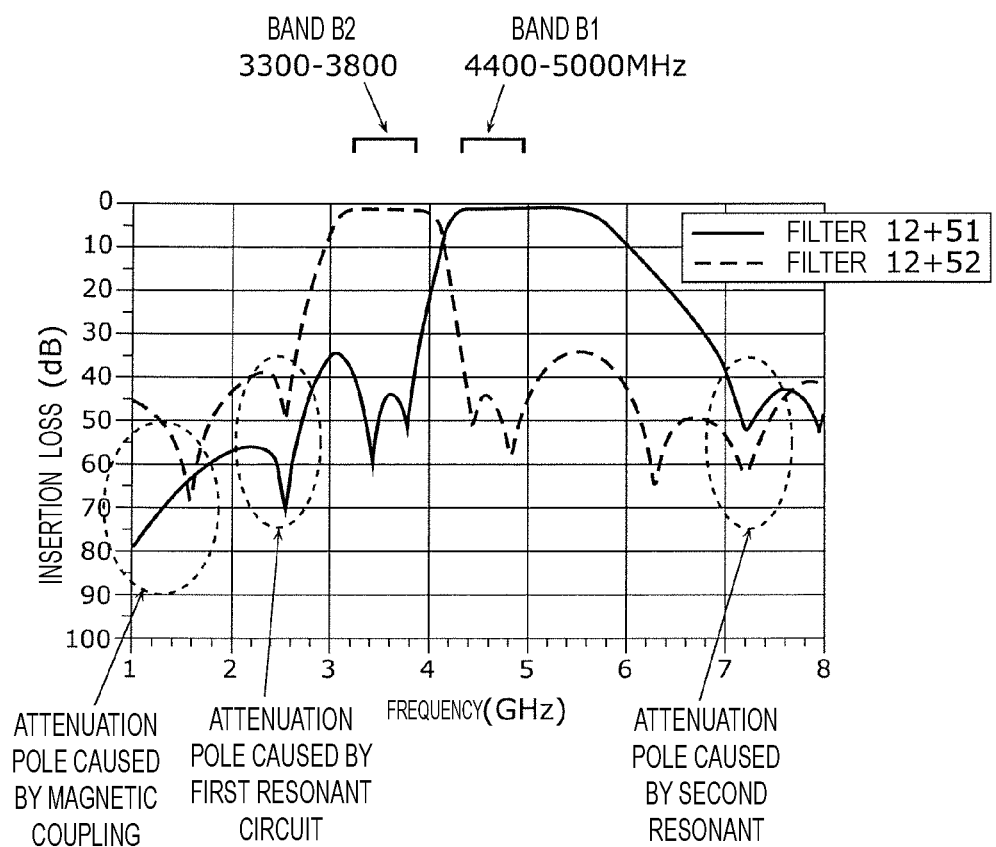
FIG. 10B is a graph illustrating a bandpass characteristic of a diplexer according to the modified example 3 of the embodiment.

FIG. 10B is a graph illustrating a bandpass characteristic of the diplexer 50 according to the modified example 3 of the embodiment. FIG. 10B illustrates the bandpass characteristic of the diplexer 50 (filter 12+filter 51) between the common terminal 102 and the input/output terminal 141 and the bandpass characteristic of the diplexer 50 (filter 12+filter 52) between the common terminal 102 and the input/output terminal 142.

As illustrated in FIG. 10B, in the diplexer 50 according to the modified example 3, a small loss is secured in both the pass bands of Band n79 (band B1) and Band n78 (band B2) belonging to 5GNR (band B). Further, the attenuation characteristic in the second communication band (HB) is secured by the first attenuation pole caused by the first resonant circuit of the filter 12, and the attenuation characteristic in the third communication band (LB/MB) is secured by the second attenuation pole caused by the magnetic coupling between the inductors L1 and L2. Furthermore, the attenuation characteristic in the second frequency band group (WiFi) is secured by the third attenuation pole caused by the second resonant circuit.

That is to say, in the diplexer 50 according to the modified example 3, the insertion loss within the first pass band is small, and a large attenuation is secured in a wide attenuation band in a lower frequency range below the first pass band and in an attenuation band in a higher frequency range above the first pass band. Furthermore, the filters 51 and 52 enable to demultiplex and multiplex 5GNR (band B) to and from Band n79 (band B1) and Band n78 (band B2).

7. Layout Configuration of Circuit Elements that Make Up First Filter

Figure 11C:
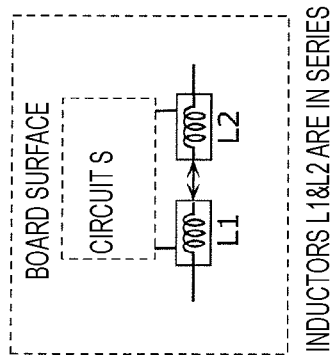
FIGS. 11A-11D include diagrams illustrating a mounting configuration of circuit elements that make up a first filter according to the embodiment.
Figure 11D:
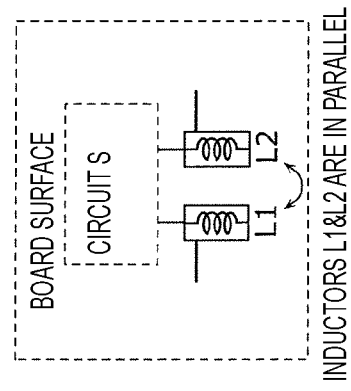
Figure 11A:
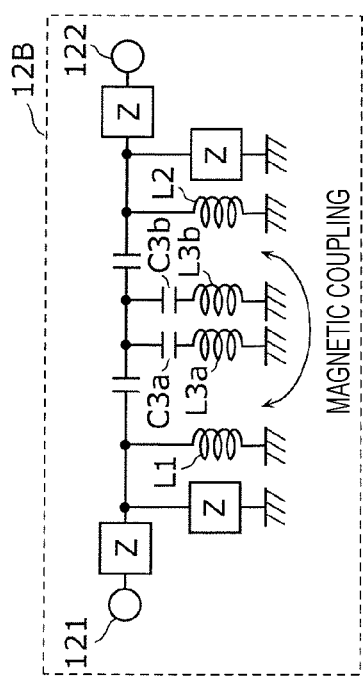
Figure 11B:
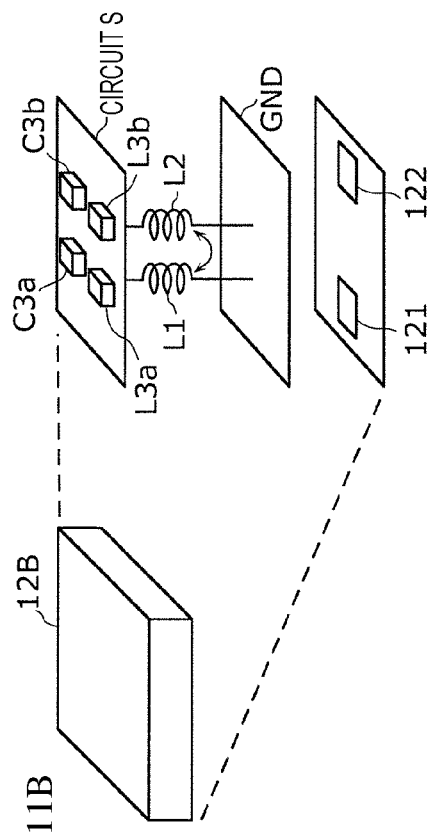

FIGS. 11A-11D include diagrams illustrating a mounting configuration of circuit elements that make up the filter 12B according to the working example 2. FIG. 11A illustrates a circuit configuration of the filter 12B according to the working example 2, FIG. 11B illustrates an exemplary layout of the circuit elements that make up the filter 12B, and FIGS. 11C and 11D each illustrates an exemplary layout of the inductors L1 and L2.

As illustrated in FIG. 11B, the circuit elements that make up the filter 12B are, for example mounted on a multilayer board. On the first layer of the multilayer board, the inductors L3a and L3b and the capacitors C3a and C3b, which make up a resonant circuit (referred to as "circuit S"), are mounted. Each of the inductors L3a and L3b and the capacitors C3a and C3b may be a surface mount element that has a chip shape and is mounted on a top layer of the multilayer board or may be an element of a type that is incorporated in a multilayer board and made up of one or more conductor patterns and one or more dielectric bodies formed in the multilayer board.

The terminals 121 and 122 are formed on the downmost layer (back surface) of the multilayer board. A GND layer is arranged between the first layer on which the circuit S is mounted and the downmost layer on which the terminals 121 and 122 are formed. Furthermore, the inductors L1 and L2 are formed on a layer between the first layer and the GND layer. The inductors L1 and L2 are each, for example, is an element of a type that is incorporated in a multilayer board and made up of one or more conductor patterns formed in the multilayer board. By forming the first layer on which the circuit S is mounted and the layer on which the inductors L1 and L2 are formed as separate layers, it becomes possible to suppress unwanted magnetic coupling between the inductors L1 and L2 and the inductors L3a and L3b that make up the circuit S.

Further, as illustrated in FIGS. 11C and 11D, the direction of magnetic flux of the inductor L1 (coil winding axis direction) and the direction of magnetic flux of the inductor L2 (coil winding axis direction) can be in the same direction. To achieve this, as illustrated in FIG. 11C, the coil winding axis direction of the inductor L1 and the coil winding axis direction of the inductor L2 may be aligned with each other in the lengthwise direction, or as illustrated in FIG. 11D, the coil winding axis direction of the inductor L1 and the coil winding axis direction of the inductor L2 may be arranged in parallel and close to each other. This enables to streamline an efficient magnetic coupling formation without necessarily increasing the inductance values of the inductors L1 and L2 and reduce the sizes of the inductors L1 and L2. As a result, it becomes possible to contribute to the size reduction of the filter 12B and the multiplexer 1.

Alternatively, in the mounting configuration of the filter 12B according to the present working example, one of the inductors L1 and L2, which are magnetically coupled with each other, may be mounted on the first layer of the multilayer board on which the circuit S is mounted, and the other of the inductors L1 and L2 may be formed between the foregoing first layer and the foregoing GND layer.

Further, the inductors L1 and L2 that are magnetically coupled with each other may be formed between the foregoing first layer and the foregoing GND layer, and of circuit elements that make up the filter 12B, all of the circuit elements other than the inductors L1 and L2 (including the impedance elements Z described in FIG. 11A) may be mounted on the foregoing first layer.

Other Embodiments

The multiplexers, the filters, and the communication devices according to the present disclosure are described using the embodiment, the working examples, and the modified examples. However, the present disclosure is not limited to the foregoing embodiment, working examples, and modified examples. Other embodiments realized by combining arbitrary constituent elements of the foregoing embodiment, working examples, and modified examples, modified examples obtained by applying various modifications apparent to those skilled in the art to the foregoing embodiment without necessarily departing the scope of the present disclosure, and various devices including the foregoing multiplexers, filters, and communication device according to the present disclosure may also be included in the present disclosure.

Further, for example, in the multiplexers, the filters, and the communication devices according to the embodiment, the working examples, and the modified examples, a matching element, such as an inductor, a capacitor, or the like, or a switch circuit may be connected between constituent elements. Note that the inductor may include a wiring line inductor formed by a wiring line connecting constituent elements.

Further, the multiplexer according to the foregoing embodiment may be employed by a receiver circuit that performs only receiving, a transmitter circuit that performs only transmitting, and a transceiver circuit that performs both transmitting and receiving.

INDUSTRIAL APPLICABILITY

The present disclosure can be widely used in communication equipment, such as cellular phones and the like as a multiplexer, a filter, and a communication device, which can be employed by a multiband system including 5GNR.

REFERENCE SIGNS LIST

1 Multiplexer
3 RF signal processing circuit (RFIC)
4 Base band signal processing circuit (BBIC)
5 Communication device
11, 12, 12A, 12B, 12C, 12D, 13, 14, 51, 52 Filter
21, 22 Antenna
31, 31A, 31B Resonant circuit
31C Frequency variable circuit
41, 42, 43, 44, 45, 46 Impedance element
50 Diplexer
61, 62, 63, 64 FE circuit
101, 102 Common terminal
111, 112, 113, 114, 141, 142 Input/output terminal
121, 122, 511, 512, 521, 522 Terminal
131, 132, 133, 134 Connection terminal
C1, C2, C3a, C3b, C4, C5, C6, C7, C8a, C8b, C9, C10, C11, C12a, C12b, C13, C14 Capacitor
L1, L2, L3a, L3b, L7, L8a, L8b, L11, L12a, L12b, L13, L14 Inductor
n1, n2, n3 Node
P1, P2 Parallel arm resonator
SW1 Switch

The invention claimed is:

1. A multiplexer that performs communication in which a first antenna radiates and receives radio frequency signals of a first frequency band group and a second antenna radiates and receives radio frequency signals of a second frequency band group, the first frequency band group including a 5th generation new radio (5GNR) communication band,
the multiplexer comprising:
a common terminal connected to the first antenna;
a first input/output terminal and a second input/output terminal;
a first filter connected between the common terminal and the first input/output terminal, the first filter having a pass band that comprises frequencies of a first radio frequency signal of a first communication band in the first frequency band group; and
a second filter connected between the common terminal and the second input/output terminal, the second filter having a pass band that comprises frequencies of a second radio frequency signal of a second communication band in the first frequency band group, the first communication band including the 5GNR communication band, and the other communication bands of the first and the second frequency band croup being different from the 5GNR communication band,
wherein:
the second frequency band group has higher frequencies than the first communication band and the second communication band has lower frequencies than the first communication band, or the second frequency band group has lower frequencies than the first communication band and the second communication band has higher frequencies than the first communication band,
the first filter comprises:
a first resonant circuit,
a first inductor connected between ground and a first node, the first node being on a path that connects the common terminal and the first input/output terminal, and
a second inductor connected between ground and a second node on the path, the second node being different than the first node, the second inductor being magnetically coupled with the first inductor, wherein a frequency of a first attenuation pole of the first filter caused by the first resonant circuit and a frequency of a second attenuation pole of the first filter caused by the magnetic coupling are closer to the second communication band than to the first communication band, and the frequency of the first attenuation pole is closer to the first communication band than to the frequency of the second attenuation pole.

2. The multiplexer according to claim 1, wherein the first resonant circuit is connected between ground and a third node on the path, the third node being located between the first node and the second node.

3. The multiplexer according to claim 1, wherein:
a frequency gap between the second frequency band group and the first communication band is smaller than a frequency gap between the first communication band and the second communication band,
the first resonant circuit is connected between ground and a third node on the path, the third node being different than the first node and the second node,
the first filter further comprises a second resonant circuit connected between ground and a fourth node on the path, the fourth node being different than the first node and the second node, and
a frequency of a third attenuation pole of the first filter from the common terminal to the first input/output terminal, caused by the second resonant circuit, is closer to the second frequency band group than to the first communication band.

4. The multiplexer according to claim 3, wherein the third node and the fourth node are the same node, and the third node and the fourth node are located between the first node and the second node on the path.

5. The multiplexer according to claim 3, wherein each of the first resonant circuit and the second resonant circuit is a LC series resonant circuit.

6. The multiplexer according to claim 3, wherein each of the first resonant circuit and the second resonant circuit is an acoustic wave resonator.

7. The multiplexer according to claim 1, further comprising:
a third filter connected to the first input/output terminal, the third filter having a pass band comprising frequencies of band n78 (3300-3800 MHz) of 5GNR; and
a fourth filter connected to the first input/output terminal, the fourth filter having a pass band comprising frequencies of band n79 (4400-5000 MHz) of 5GNR to pass.

8. The multiplexer according to claim 1, wherein the first resonant circuit comprises a switch configured to selectively change a resonant frequency of the first resonant circuit.

9. The multiplexer according to claim 1, wherein:
the first frequency band group has lower frequencies than the second frequency band group, and
the frequency of the first attenuation pole is greater than the frequency of the second attenuation pole.

10. A communication device comprising:
the multiplexer according to claim 1;
the first antenna and the second antenna; and a radio frequency (RF) signal processing circuit configured to process radio frequency signals received by the first antenna and the second antenna, wherein the multiplexer is configured to pass radio frequency signals between the first antenna and the RF signal processing circuit, and between the second antenna and the RF signal processing circuit.

11. A multiplexer that performs communication in which a first antenna radiates and receives radio frequency signals of a first frequency band group and a second antenna radiates and receives radio frequency signals of a second frequency band group, the first frequency band group including a 5th generation new radio (5G NR) communication band, the multiplexer comprising:

a common terminal connected to the first antenna;

a first input/output terminal and a second input/output terminal;

a first filter connected between the common terminal and the first input/output terminal, the first filter having a pass band that comprises frequencies of a first radio frequency signal of a first communication band in the first frequency band group; and a second filter connected between the common terminal and the second input/output terminal, the second filter having a pass band that comprises frequencies of a second radio frequency signal of a second communication band in the first frequency band group, the first communication band including the 5G NR communication band, and the other communication bands of the first and second frequency band group being different from the 5GNR communication band, wherein:

the second frequency band group has higher frequencies than the first communication band and the second communication band has lower frequencies than the first communication band, or the second frequency band group has lower frequencies than the first communication band and the second communication band has higher frequencies than the first communication band, a first filter comprising:

a first terminal and a second terminal;

a first inductor connected between ground and a first node, the first node being on a path that connects the first terminal and the second terminal;

a second inductor connected between the ground and a second node on the path, the second node being different than the first node, the second inductor being magnetically coupled with the first inductor;

a first resonant circuit connected between ground and a third node on the path, the third node being located between the first node and the second node; and a second resonant circuit connected between the ground and the third node, wherein each of the first resonant circuit and the second resonant circuit is a LC series resonant circuit, wherein a frequency of a first attenuation pole of the first filter caused by the first resonant circuit and a frequency of a second attenuation pole of the first filter caused by the magnetic coupling are closer to the second communication band than to the first communication band, and the frequency of the first attenuation pole is closer to the first communication band than to the frequency of the second attenuation pole.

12. The filter according to claim 11, wherein the filter is configured to filter radio frequency signals of a 5th generation new radio (5GNR) communication band.

13. The filter according to claim 11, wherein the first resonant circuit comprises a switch configured to selectively change in a resonant frequency of the first resonant circuit.

14. The filter according to claim 11, wherein a frequency of a first attenuation pole of the filter caused by the first resonant circuit is greater than a frequency of a second attenuation pole of the filter caused by the magnetic coupling.

* * * * *